US006370073B2

(12) United States Patent
Leung

(10) Patent No.: US 6,370,073 B2
(45) Date of Patent: Apr. 9, 2002

(54) SINGLE-PORT MULTI-BANK MEMORY SYSTEM HAVING READ AND WRITE BUFFERS AND METHOD OF OPERATING SAME

(75) Inventor: Wingyu Leung, Cupertino, CA (US)

(73) Assignee: Monlithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/768,908

(22) Filed: Jan. 23, 2001

Related U.S. Application Data

(63) Continuation-in-part of application No. 09/405,607, filed on Sep. 24, 1999, which is a continuation-in-part of application No. 09/165,228, filed on Oct. 1, 1998, now Pat. No. 5,999,474.

(51) Int. Cl.[7] .............................. G11C 7/00; G11C 8/00

(52) U.S. Cl. .................. 365/222; 365/49; 365/189.05; 365/230.08

(58) Field of Search ........................... 365/222, 230.03, 365/49, 189.05, 230.08

(56) References Cited

U.S. PATENT DOCUMENTS

| | | | |
|---|---|---|---|
| 4,549,284 A | 10/1985 | Ikuzaki | |
| 5,295,109 A | 3/1994 | Nawaki | 365/222 |
| 5,471,601 A | 11/1995 | Gonzales | 395/403 |
| 5,559,750 A | 9/1996 | Dosaka et al. | 365/230.06 |
| 5,583,823 A | * 12/1996 | Park | 365/222 |
| 5,642,320 A | 6/1997 | Jang | 365/222 |
| 5,659,515 A | 8/1997 | Matsuo et al. | 365/222 |
| 5,859,809 A | 1/1999 | Kim | 365/222 |
| 5,875,452 A | * 2/1999 | Katayama et al. | 365/233 |
| 5,940,851 A | 8/1999 | Leung | 711/106 |

FOREIGN PATENT DOCUMENTS

| EP | 0 811 979 A2 | 12/1997 | G11C/7/00 |
|---|---|---|---|
| WO | 97/03954 | 10/1997 | G11C/11/407 |

OTHER PUBLICATIONS

"An Access–Sequence Control Scheme To Enhance Random–Access Performance Of Embedded DRAM's", Ayukawa et al., IEEE 5/1998, pp. 800–806.
"16Mbit Enhanced SDRAM Family 4M×4, 2M×8, 1M×16", 1997 Enhanced Memory Systems, pp. 1–8.
"Toshiba Integrated Circuit Technical Data", Toshiba Corporation.
"MD904 to MD920, 1/2 to 21/2 Mbyte Multibank DRAM (MDRAM) 128K×32 to 656K×32". Mosys Inc., 1996, pp. 1–16.

* cited by examiner

Primary Examiner—Son T. Dinh
(74) Attorney, Agent, or Firm—E. Eric Hoffman; Bever, Hoffman & Harms, LLP

(57) ABSTRACT

A method and apparatus for handling the refresh of a DRAM array or other memory array requiring periodic refresh operations so that the refresh does not require explicit control signaling nor handshake communication between the memory array and an external accessing client. The method and apparatus handles external accesses and refresh operations such that the refresh operations do not interfere with the external accesses under any conditions. As a result, an SRAM compatible device can be built from DRAM or 1-Transistor cells. A single-port multi-bank refresh scheme is used to cut down the number of collisions between memory refresh operations and memory data access operations. A read buffer is used to buffer read data, thereby allowing memory refresh operations to be performed when consecutive read accesses hit the address range of a particular memory bank for a long period of time. A write buffer is used to buffer write data, thereby allowing memory refresh operations to be performed when consecutive write accesses hit the address range of a particular memory bank for a long period of time. Both the read buffer and the write buffer can be constructed of DRAM cells.

46 Claims, 13 Drawing Sheets

SINGLE-PORT MULTI-BANK MEMORY SYSTEM HAVING READ AND WRITE BUFFERS AND METHOD OF OPERATING SAME

RELATED APPLICATIONS

The present application is a continuation-in-part of U.S. patent application Ser. No. 09/405,607, by Wingyu Leung, entitled "Read/Write Buffers for Complete Hiding of the Refresh of a Semiconductor Memory and Method of Operating Same" filed Sep. 24, 1999, which is a continuation-in-part of U.S. patent application Ser. No. 09/165,228 filed Oct. 1, 1998 now U.S. Pat. No. 5,999,474, by Wingyu Leung and Fu-Chieh Hsu, entitled "Method and Apparatus for Complete Hiding of the Refresh of a Semiconductor Memory" which issued Dec. 7, 1999.

The present application is further related to U.S. patent application Ser. No. 09/037,396, by Wingyu Leung, entitled "Method and Apparatus for 1-T SRAM Compatible Memory" and filed Mar. 9, 1998; U.S. patent application Ser. No. 09/234,778, by Wingyu Leung, entitled "Method and Apparatus For Refreshing A Semiconductor Memory using Idle Memory Cycles" filed Jan. 20, 1999, and U.S. patent application Ser. No. 09/181,840, by Wingyu Leung, entitled "Method and Apparatus for Increasing The Time Available for Refresh For 1-T SRAM Compatible Devices", filed Oct. 27, 1998. These patent applications are hereby incorporated by reference.

FIELD OF THE INVENTION

The present invention is related to semiconductor memories, especially dynamic random access memory (DRAM). In particular, the present invention relates to a method and apparatus of handling refresh operations in a semiconductor memory such that the refresh operations do not interfere with external access operations.

DISCUSSION OF RELATED ART

A conventional DRAM memory cell, which consists of one transistor and one capacitor, is significantly smaller than a conventional SRAM cell, which consists of 4 to 6 transistors. However, data stored in a DRAM cell must be periodically refreshed, while the data stored in an SRAM cell has no such requirement. Each refresh operation of a DRAM cell consumes memory bandwidth. For example, the cycle time of a 200 MHz DRAM array is 5 nsec. In this DRAM array, each external access takes 5 nsec, and each refresh access takes at least 5 nsec. Because an external access and a refresh access can be initiated at the same time, the DRAM array must be able to handle both within the allowable access cycle time so as to prevent the refresh access from interfering with the external access. This limits the minimum external access cycle time to be no less than 10 nsec, with 5 nsec for handling the external access and 5 nsec for handling the refresh access. This is true even though the refresh accesses are performed, on average, at a frequency of less than 100 KHz. As a result, the maximum accessing frequency of the DRAM array must be less than or equal to 100 MHz. Thus, a 200 MHz DRAM memory array is required to create a device capable of operating at 100 MHz. This is simply not economical.

Previous attempts to use DRAM cells in SRAM applications have been of limited success for various reasons. For example, one such DRAM device has required an external signal to control refresh operations. (See, 131,072-Word by 8-Bit CMOS Pseudo Static RAM, Toshiba Integrated Circuit Technical Data (1996).) Moreover, external accesses to this DRAM device are delayed during the memory refresh operations. As a result, the refresh operations are not transparent and the resulting DRAM device cannot be fully compatible with an SRAM device.

In another prior art scheme, a high-speed SRAM cache is used with a relatively slow DRAM array to speed up the average access time of the memory device. (See, U.S. Pat. No. 5,559,750 by Katsumi Dosaka et al, and "Data Sheet of 16 Mbit Enhanced SDRAM Family 4M×4, 2M×8, 1M×16" by Enhanced Memory Systems Inc., 1997.) The actual access time of the device varies depending on the cache hit rate. Circuitry is provided to refresh the DRAM cells. However, the refresh operation is not transparent to external accesses. That is, the refresh operations affect the memory access time. Consequently, the device cannot meet the requirement of total deterministic random access time.

Other prior art schemes use multi-banking to reduce the average access time of a DRAM device. Examples of multi-banking schemes are described in "Data sheet, MD904 To MD920, Multi-bank DRAM (MDRAM) 128K× 32 to 656K×32" by MoSys Inc., 1996, and in "An Access-Sequence Control Scheme to Enhance Random-Access Performance of Embedded DRAM's" by Kazushige Ayukawa et al, IEEE JSSC, vol. 33, No. 5, May 1998, pp. 800–806. These multi-banking schemes do not allow an individual memory bank to delay a refresh cycle.

Another prior art scheme uses a read buffer and a write buffer to take advantage of the sequential or burst nature of an external access. An example of such a prior art scheme is described in U.S. Pat. No. 5,659,515, entitled "Semiconductor Memory Device Capable of Refresh Operation in Burst Mode" by R. Matsuo and T. Wada. In this scheme, a burst access allows a register to handle the sequential accesses of a transaction while the memory array is being refreshed. However, this scheme does not allow consecutive random accesses. For example, the memory cannot handle a random access per clock cycle.

Another prior art scheme that attempts to completely hide refresh operations in a DRAM cell includes the scheme described in U.S. Pat. No. 5,642,320, entitled "Self-Refreshable Dual Port Dynamic CAM Cell and Dynamic CAM Cell Array Refreshing Circuit", by H. S. Jang. In this scheme, a second port is added to each of the dynamic memory cells so that refresh can be performed at one port while a normal access is carried out at the other port. The added port essentially doubles the access bandwidth of the memory cell, but at the expense of additional silicon area.

Accordingly, it would be desirable to have a memory device that utilizes area-efficient DRAM cells, and handles the refresh of the DRAM cells in a manner that is completely transparent to an accessing memory client external to the memory device. That is, it would be desirable for the refresh operations to be successfully performed without relying on unused external access time. Stated another way, it would be desirable to have a memory device that allows the use of DRAM cells or other refreshable memory cells for building SRAM compatible devices or other compatible memory devices that do not require refresh. It would further be desirable for the memory device to utilize a single read/write port, thereby minimizing power consumption and required layout area.

SUMMARY

Accordingly, the present embodiment provides a memory device or an embedded memory block that includes a plurality of memory cells which must be periodically refreshed in order to retain data values, and a memory controller for accessing and refreshing the memory cells. In one embodiment, the memory cells are DRAM cells. The memory controller controls the accessing and refreshing of the memory cells such that the refreshing of the memory cells does not interfere with any external access of the memory cells.

In one embodiment, the memory cells are arranged in a plurality of independently controlled, single-port memory banks. Thus, read, write and refresh operations are independently controlled within each memory bank. In the preferred embodiment, each bank contains 32 rows and 512 columns. Each of the memory banks is coupled in parallel to a write buffer, a read buffer and an I/O interface through a single read/write port. In one embodiment the read buffer and the write buffer each have the same configuration as the memory banks. In another embodiment, the read buffer and/or write buffer can be constructed using SRAM cells.

The memory device is refreshed using a multi-bank refresh scheme. A central refresh timer generates a refresh request signal, which is provided to the memory banks, the read buffer and the write buffer during every proper refresh period. The proper refresh period is set equal to or less than the required refresh period of one of the memory cells, divided by the number of rows in a memory bank. In one embodiment, the refresh request signal is broadcast to all the memory banks. In another embodiment, daisy-chained connections sequentially pass the refresh request signal to the memory banks, the read buffer and the write buffer in response to a clock signal. A central refresh address generator generates a refresh address, which is provided to all of the memory banks in parallel. The refresh address generator increments the refresh address each time the refresh request signal is asserted. When the refresh request signal is activated, a memory bank executes a refresh cycle if there is no access conflict. Otherwise, the refresh cycle is delayed until there is no access conflict.

The memory controller ensures that each memory bank, the read buffer and the write buffer are properly refreshed during the proper refresh period. More specifically, the memory controller (and the configuration of the memory device) ensures that each of the memory banks will have at least one idle cycle during the proper refresh period, even under worst case conditions. A refresh operation can be completed within one clock cycle. Thus, by providing at least one idle cycle during the proper refresh period, the memory banks can fulfill their refresh obligations by using this idle cycle to perform a refresh operation.

An idle cycle in a memory bank is created when there is no external access, or when an access hits another bank. In general, the memory controller ensures that the external access switches banks at least once within a proper refresh period, such that all of the memory banks can be refreshed properly. The read and write buffers create at least one idle memory cycle for a memory bank that is accessed continuously for an entire proper refresh period.

The entries of the write buffer are independently tagged. In a particular embodiment, the write buffer is implemented as an undivided, direct-map buffer. The read buffer is configured to shadow a portion of one of the memory banks.

In one embodiment, read accesses to the memory system are implemented as follows. If a refresh request is pending in the read buffer when a read access is detected, then the read buffer is refreshed. If the read access misses the write buffer, then the desired data value is read from one of the memory banks. If the read access hits the write buffer, the desired data value is read from the write buffer, written to a corresponding memory bank, and the corresponding entry of the write buffer is then invalidated.

If no refresh request is pending in the read buffer, then a read access is handled as follows. If the read access hits the write buffer, then a data value is read from the write buffer and written to a corresponding memory block. The corresponding entry of the write buffer is then invalidated. If the read access does not hit the write buffer, but hits the read buffer, then a data value is read from the read buffer. If the read access does not hit the write buffer or the read buffer, then a data value is read from one of the memory banks and written to the read buffer.

In one embodiment, write accesses to the memory system are implemented as follows. If a write access hits the read buffer, then the corresponding entry of the read buffer is invalidated. If a write access occurs when a write buffer refresh is pending, then the write buffer is refreshed, and the data value associated with the write access is written directly to the addressed memory bank. If this write access hits the write buffer, then a corresponding entry in the write buffer is invalidated.

If a write access occurs when no write buffer refresh is pending, and the write access hits the write buffer, then the data value associated with the write access is written directly to the write buffer.

If a write access occurs when no write buffer refresh is pending, and the write access misses the write buffer, then a write allocate operation is performed. The write allocate operation includes the steps of: (1) reading a first data value from the write buffer during a first half-cycle of the write access, (2) writing the first data value to one of the memory banks during the first half-cycle of a write access, and (3) writing a second data value to the write buffer during a second half-cycle of the write access.

In an alternative embodiment, burst or multiple refreshes can be used so that within a proper refresh period a fixed number of refresh operations has to be performed. For example, if the refresh time of the memory cells is 1 ms, the proper refresh time can be set at 1 ms during this period, a total of 32 refresh cycles has to be performed to refresh every row within a bank. In this case, 32 idle cycles must occur in the proper refresh period in order to refresh the memory properly. This embodiment is a simple extension of the single cycle refresh scheme described above. The operation of the read and write buffer used to create the idle cycles in both schemes are the same.

The present invention will be more fully understood in view of the following description and drawings.

DETAILED DESCRIPTION

In accordance with the present invention, an SRAM compatible device is designed using DRAM cells. This SRAM compatible device is hereinafter referred to as a one-transistor SRAM (1-T SRAM).

Figure 1:
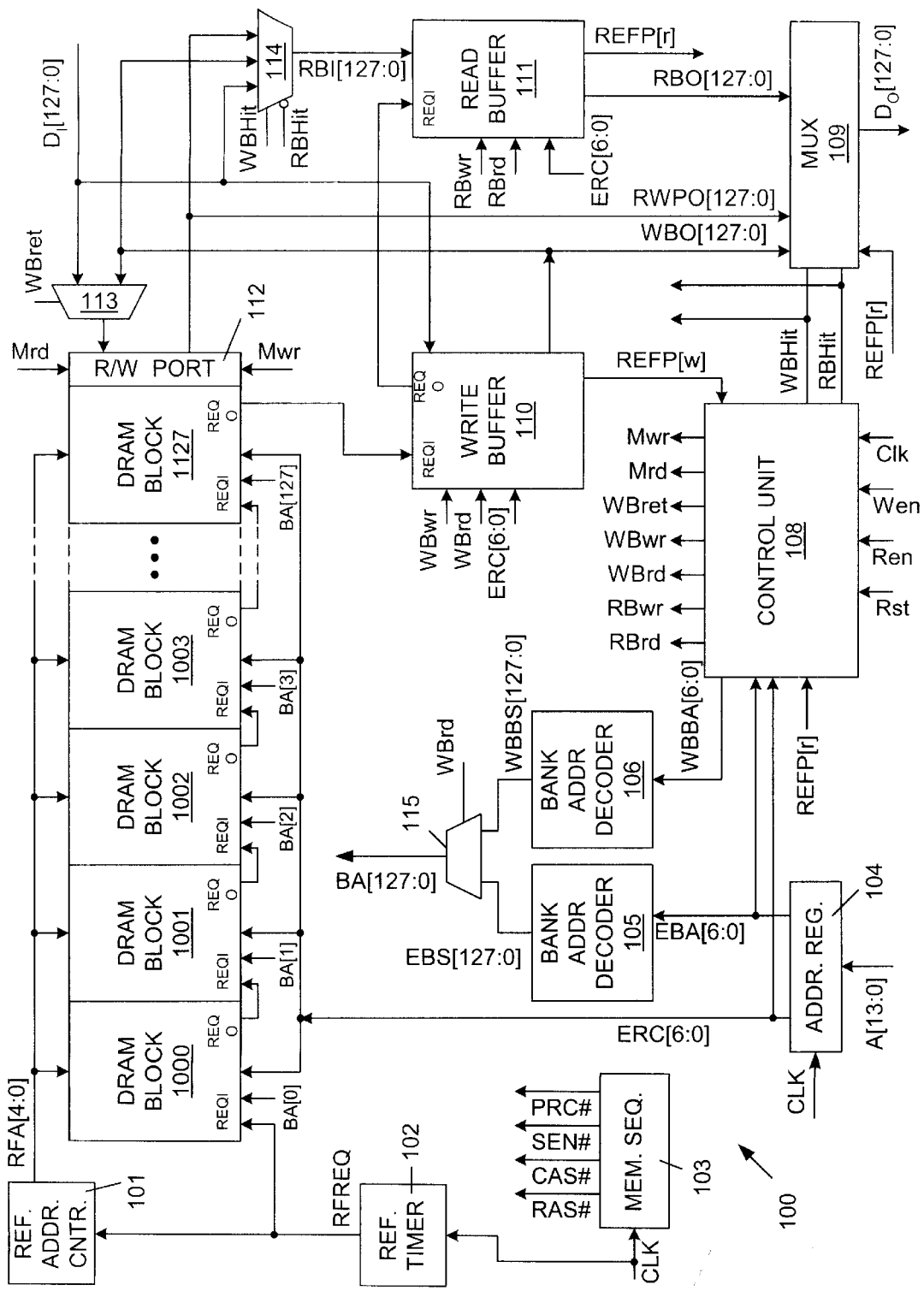
FIG. 1 is a block diagram of a 1-T SRAM in accordance with one embodiment of the present invention.

FIG. 1 is a block diagram of a 1-T SRAM system 100 in accordance with one embodiment of the present invention. 1-T SRAM system 100 includes 128 DRAM memory blocks 1000–1127, refresh address counter 101, refresh timer 102, memory sequencer 103, address register 104, bank address decoders 105–106, memory control unit 108, multiplexer 109, write buffer 110, read buffer 111, read/write port 112 and multiplexers 113–115.

DRAM memory blocks 1000–1127 are capable of storing 16K 128-bit words. Each of memory blocks 1000–1127 has a corresponding DRAM bank (for a total of 128 banks) arranged in an array having 32 rows by 512 columns, such that each bank is capable of storing 128 128-bit data values. The external interface of system 100 includes a 128-bit input data bus for receiving input data bits DI[127:0], a 128-bit output data bus for providing output data bits DO[127:0], a read enable line for receiving an external read enable (Ren) signal, a write enable line for receiving an external write enable (Wen) signal, a clock input terminal for receiving a system clock (Clk) signal, and a 14-bit address bus for receiving external address bits A[13:0]. As described in more detail below, each of the DRAM banks in blocks 1000–1127 contains a corresponding row address decoder and a corresponding column address decoder.

All external signals are referenced to the rising edge of the Clk signal. The address signal A[13:0] is divided into 3 fields: a 7-bit bank address A[13:7] (which identifies one of the 128 memory blocks 1000–1127), a 5-bit row address A[6:2] (which identifies one of the 32 rows in a memory bank) and a 2-bit word (column) address A[1:0] (which identifies one of the four 128-bit words in a row). Address bits A[6:0] are collectively referred to as the external row-column address. DRAM memory blocks 1000–1127 are connected in parallel to a plurality of drivers in read-write port 112, which serves as a bi-directional port to memory blocks 1000–1127. Read-write port 112 serves as the interface between DRAM memory blocks 1000–1127, write buffer 110, read buffer 111, and the rest of the I/O logic. The bus connections between the various elements of 1-T SRAM system 100 are illustrated in FIG. 1.

To ensure that all refresh accesses of memory blocks 1000–1127 are properly performed within a predetermined refresh period, even under the worst case cache thrashing conditions, the size of the write buffer 110 and read buffer 111 are each selected to have a storage capacity equal to or greater than the storage capacity of one of the DRAM memory blocks 1000–1127, minus the capacity of one row of cells in the DRAM memory block. In light of simplicity of design, in the embodiment described below, both write buffer 110 and read buffer 111 include a memory bank with the same organization as the memory banks in DRAM memory blocks 1000–1127. Thus, in the described embodiment, both write buffer 110 and read buffer 111 include a memory bank having an array of 32 rows by 512 columns of memory cells. These memory cells can be constructed using either SRAM cells or DRAM cells. The following description assumes that write buffer 110 and read buffer 111 are implemented using DRAM cells, such that write buffer 110 and read buffer 111 must be periodically refreshed. If write buffer 110 and read buffer 111 were implemented using SRAM cells, the resulting memory device would operate in a similar manner, but without the requirement of refreshing write buffer 110 and read buffer 111.

In the address path, the external accessing address signal A[13:0] is latched in address register 104. In response, address register 104 provides a 7-bit external bank address signal EBA[6:0] to bank address decoder 105 and memory control unit 108. External bank address signal EBA[6:0] (which consists of address signals A[13:7]) identifies the bank of the current access operation. In response to the external bank address signal EBA[6:0], bank address decoder 105 generates a 128-bit external bank-select signal EBS[127:0], which identifies the bank of the current access operation. The external bank-select signal EBS[127:0] includes one logic high signal corresponding to the addressed bank, and 127 logic low signals corresponding to the non-addressed banks. External bank-select signal EBS[127:0] is provided to multiplexer 115.

Address register 104 also provides an external row-column address signal ERC[6:0], which identifies the row and column addresses of the current access operation. The external row-column address signal ERC[6:0] is selected to correspond with external address bits A[6:0]. The external row-column address signal ERC[6:0] is provided in parallel to each of memory blocks 1000–1127, write buffer 110, read buffer 111, and memory control unit 108.

Bank address decoder 106 is coupled to receive a write buffer bank address WBBA[6:0] from memory control unit 108. As described in more detail below, the WBBA[6:0] signal identifies a bank address associated with an entry in write buffer 110. More specifically, the WBBA[6:0] signal identifies a bank address associated with the entry of write buffer 110 corresponding with the row-column address signal ERC[6:0]. In response to the WBBA[6:0] signal, bank address decoder 106 generates a 128-bit write buffer bank-select signal WBBS[127:0], which identifies the bank associated with the write buffer entry. The write buffer bank-select signal WBBS[127:0] includes one logic high signal corresponding to the identified bank, and 127 logic low signals corresponding to the non-identified banks. Write buffer bank-select signal WBBS[127:0] is provided to multiplexer 115.

Multiplexer 115 routes either the external bank-select signal EBS[127:0] or the write buffer bank-select signal WBBS[127:0] to create the bank access signal BA[127:0]. Each of the 128 bank access bits BA[127:0] is connected to a corresponding one of memory blocks 1000–1127. Multiplexer 115 routes the external bank-select signal EBS[127:0] if the write buffer read signal WBrd is de-activated. Multiplexer 115 routes the write buffer bank-select signal WBBS [127:0] if the write buffer read signal WBrd is activated. The write buffer read signal WBrd is described in more detail below. In general, the write buffer bank select signal WBBS [127:0] is used to access memory blocks 1000–1127 when a data value from write buffer 110 is written to memory blocks 1000–1127. The external bank-select signal EBS[127:0] is used to access memory blocks 1000–1127 during other read and write accesses.

Each of the DRAM banks in memory blocks 1000–1127 is independently controlled. Thus, read, write and refresh operations are independently controlled within each bank. Each of memory blocks 1000–1127 is coupled in parallel to both write buffer 110 and read buffer 111 through read-write port 112. Both write buffer 110 and read buffer 111 have the same structure as the memory banks in memory blocks 1000–1127.

Memory system 100 is refreshed using a multi-bank refresh scheme. In the preferred embodiment, central refresh timer 102 is used to generate periodic refresh requests to DRAM memory blocks 1000–1127. Refresh timer 102 generates the refresh request by driving its output signal RFREQ high for one clock cycle every 1 msec. Thus, in a 100 MHz system, the refresh request signal RFREQ is asserted high once every 100,000 clock cycles. The RFREQ signal is driven to the input terminal REQI of memory block 1000 as input refresh request signal REQI[0]. Inside memory block 1000, the REQI[0] signal is provided to the input terminal of a D-register. (See, D-register 321 of FIG. 3.) The REQI[0] signal is latched into the D-register on the rising edge of the Clk signal. The output terminal of the D-register is connected to provide an output refresh request signal REQO[0] at output terminal REQO. The REQO[0] signal is therefore driven high one clock cycle after the REQI[0] signal is activated high. Each output terminal REQO is connected to an input terminal REQI of a neighboring memory block. The refresh request to the memory blocks is thus generated by a daisy chain formed by the D-registers connecting to the REQI and REQO terminals of the memory blocks 1000–1127.

In the described embodiment, write buffer 110 and read buffer 111 are constructed from DRAM cells, and the refresh request signal RFREQ is propagated from memory block 1127 to write buffer 110 and read buffer 111 as illustrated in FIG. 1. Write buffer 110 and read buffer 111 generate refresh pending signals REFP[w] and REFP[r], respectively, to indicate whether a refresh is pending within these buffers 110–111.

A 5-bit refresh address RFA[4:0] is generated by refresh address counter 101. The refresh address RFA[4:0] is incremented each time the RFREQ signal is asserted high. The 5-bit refresh address RFA[4:0] is broadcast to all of DRAM memory blocks 1000–1127, write buffer 110 and read buffer 111. The refresh address RFA[4:0] designates the row location in memory blocks 1000–1127 to be refreshed before the next activation of the RFREQ signal. The proper refresh period in this embodiment is defined as the time elapsed between two activations of the RFREQ signal (i.e., the period of refresh timer 102). The proper refresh period is set equal to or less than the refresh time of a memory cell divided by the number of rows in a memory bank.

In another embodiment, the refresh request signal RFREQ is broadcast to all of memory blocks 1000–1127.

Organization of Memory Blocks 1100–1127

Figure 2:
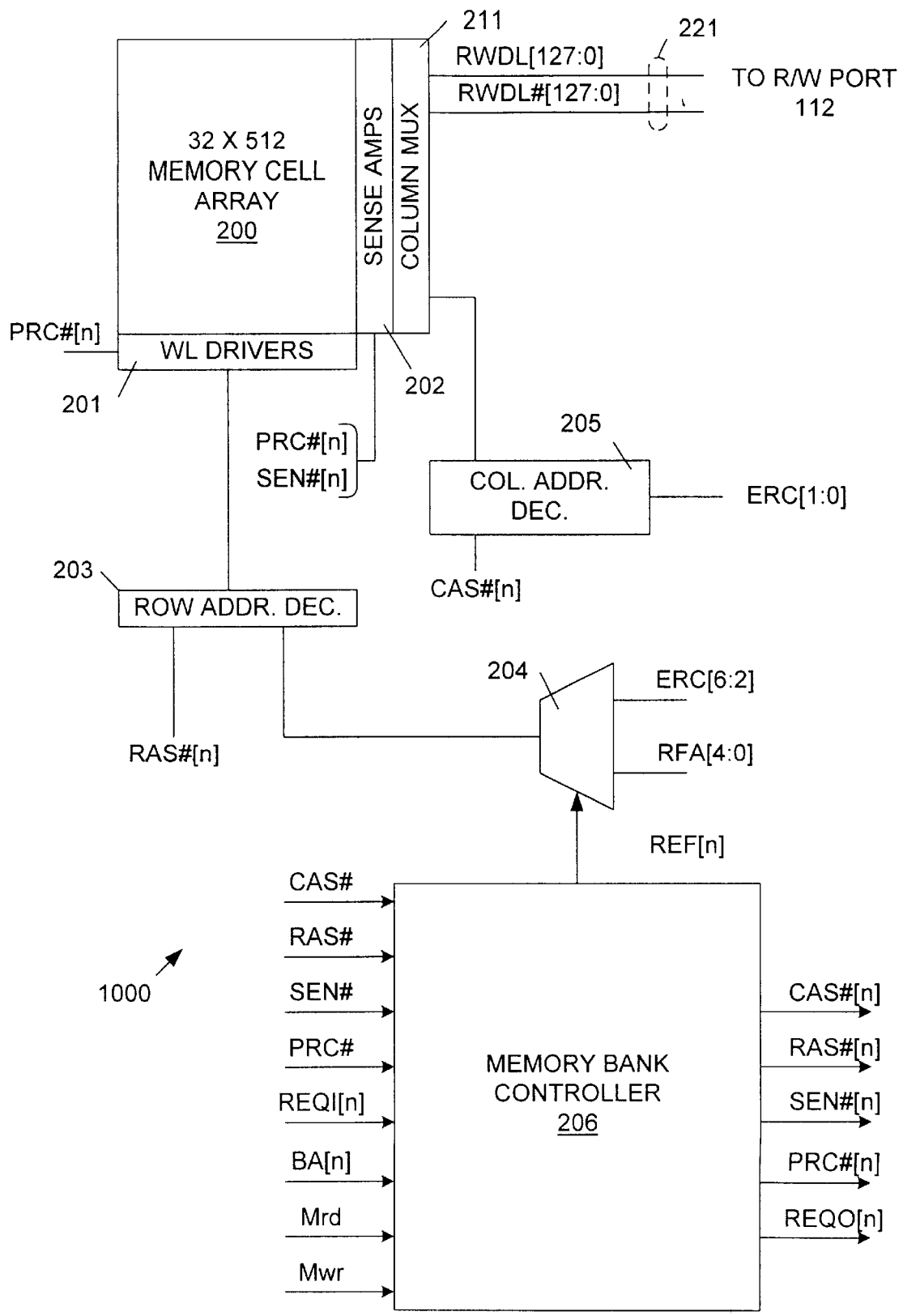
FIG. 2 is a block diagram of a memory block of the 1-T SRAM system of FIG. 1 in accordance with one embodiment of the present invention.

FIG. 2 is a block diagram of memory block 1000 in accordance with one embodiment of the present invention. In the described embodiment, memory blocks 1001–1127 are identical to memory block 1000. Memory block 1000 includes a memory array 200 having 32 rows and 512 columns of memory cells. Memory array 200 consists of ordinary DRAM cells with one transistor and one capacitor. Memory block 1000 completes a RAS cycle or a memory cycle in one cycle of the Clk signal. Therefore, memory block 1000 can process one random access or a row refresh in one clock cycle. During memory operations, one of memory blocks 1000–1127 can communicate with read/write port 112.

Memory block 1000 includes all the conventional circuits associated with a DRAM array such as word line drivers 201 and sense amplifiers 202. Memory block 1000 also includes row address decoder 203, row address multiplexer 204, column address decoder 205, memory bank controller 206 and column multiplexer 211. Column multiplexer 211 connects sense amplifiers 202 to read-write port 112.

Column multiplexer 211 is controlled by column address decoder 205. Column address decoder 205 is enabled in response to a logic low CAS#[n] signal. As described in more detail below, the CAS#[n] signal is generated by memory bank controller 206. Once enabled, column address decoder 205 decodes the column address bits ERC[1:0] of external row-column address ERC[6:0]. In response, column address decoder 205 causes column multiplexer 211 to selectively couple 128 of sense amplifiers 202 to bus 221.

Row address decoder 203 activates the word line designated by the output of row address multiplexer 204. Row address multiplexer 204 is controlled by the local refresh signal REF[n], (which is described in more detail below). In the default mode when the local refresh signal REF[n] is low, row address multiplexer 204 is controlled to route the row address bits ERC[6:2] of external row-column address ERC[6:0] to row address decoder 203. When memory block 1000 is handling a refresh operation, the local refresh signal REF[n] is high, and row address multiplexer 204 is controlled to route the global refresh address RFA[4:0] to row address decoder 203. When enabled by a logic low RAS#[n] signal, row address decoder 203 decodes the address received from multiplexer 204, thereby causing word line drivers 201 to activate a row (word line) of memory array 200.

The operations of memory cell array 200 (such as word line enable, sense amplifier enable, column switch enable and bit line pre-charge enable) are controlled by the local signals RAS#[n], SEN#[n], CAS#[n], and PRC#[n] generated by memory bank controller 206. The functions of these signals are described in commonly owned, co-pending U.S. patent application Ser. No. 09/076,608, which is hereby incorporated by reference in its entirety. Activation of the RAS#[n] signal deactivates the bit-line equalization and activates row address decoder, which results in the activation of a word line selected by the row address. Activation of the SEN#[n] signal causes the activation of the sense amplifiers in the memory bank. Activation of the CAS#[n] signal causes the sense amplifiers 202 to be coupled to read-write port 112 through column multiplexer 211 and data bus 221, which carries data signals RWDL[127:0] and complementary data signals RWDL#[127:0] in a bi-directional manner. Data bus 221 is connected in parallel to memory blocks 1001–1127 in a similar manner.

Activation of the PRC#[n] signal turns off column multiplexer 211, turns off the activated word line, deactivates sense amplifiers 202 and activates bit-line equalization circuitry (not shown).

Memory bank controller 206

Figure 3:
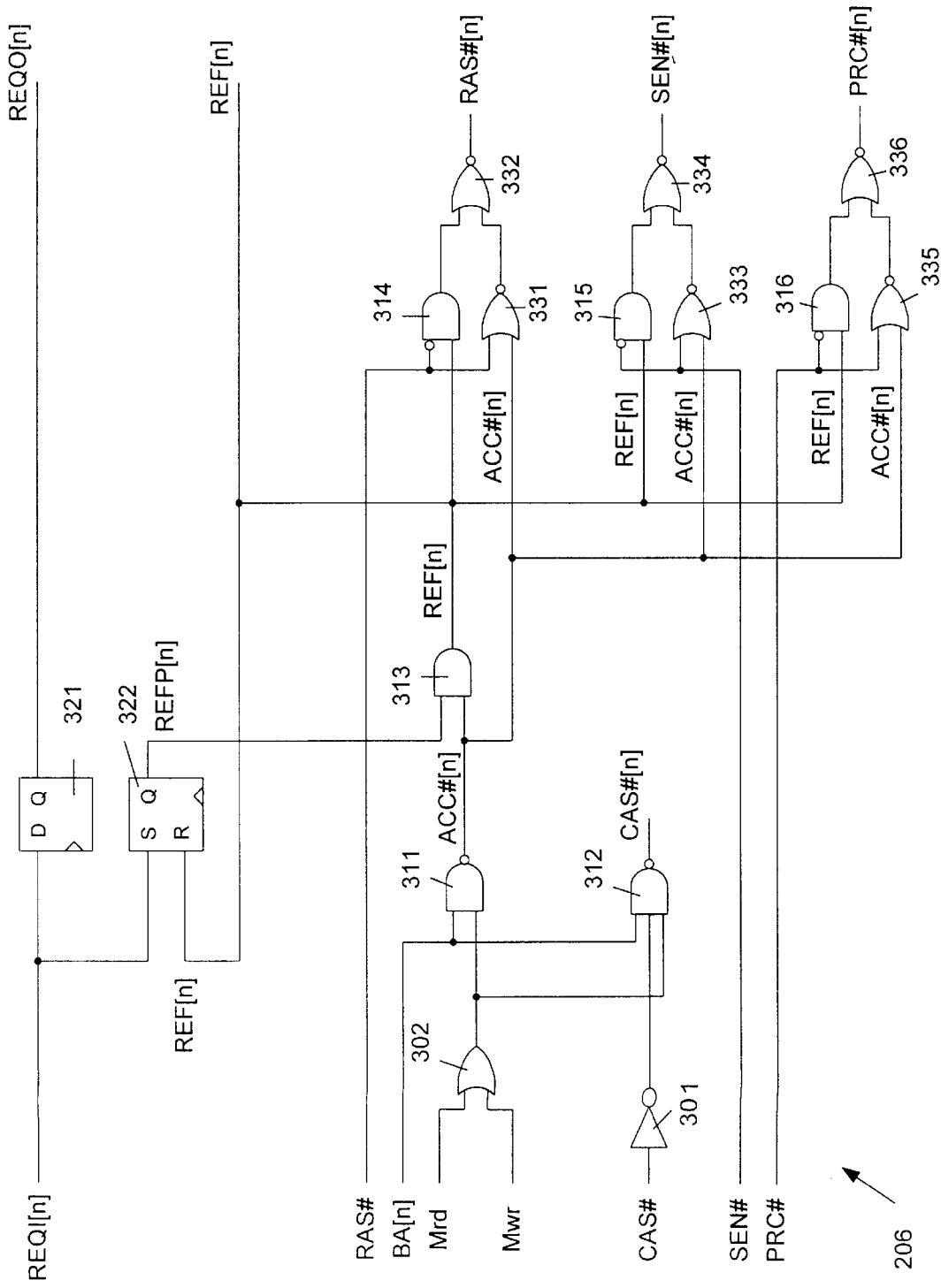
FIG. 3 is a circuit diagram of a memory bank controller of the memory block of FIG. 2 in accordance with one embodiment of the present invention.

FIG. 3 is a circuit diagram of memory bank controller 206 in accordance with one embodiment of the present invention. Memory bank controller 206 includes inverter 301, OR gate 302, NAND gates 311–312, AND gates 313–316, D-register 321, S-R register 322, and NOR gates 331–336.

As described above, the input refresh request signal REQI[n] is latched into D-register 321 in response to the rising edge of the Clk signal. D-register 321 provides an output refresh request signal REQO[n] to the adjacent memory block in a daisy-chained manner.

The input refresh request signal REQI[n] is also provided to the set terminal of S-R register 322. When the input request signal REQI[n] has a logic high value, indicating that a refresh should be performed in memory block 1000, a rising edge of the Clk signal will latch a logic high value into S-R register 322. This logic high value is provided at the output terminal of S-R register 322 as the local refresh pending signal REFP[n]. The REFP[n] signal remains high until reset by a logic high local refresh signal REF[n] that indicates the pending refresh has been performed.

The local RAS#[n], CAS#[n], SEN#[n], and PRC#[n] signals are triggered by the global timing control signals RAS#, CAS#, SEN#, and PRC#, respectively. The global timing control signals RAS#, CAS#, SEN#, and PRC# are generated by timing sequencer 103 in FIG. 1. The construct of timing sequencer 103 is similar to the timing sequencer described in U.S. patent application Ser. No. 09/076,608, and therefore generates global timing control signals having fixed phase relationships. Memory sequencer 103 is activated every cycle of the Clk signal. As a result, the global timing signals RAS#, CAS#, SEN#, and PRC# are generated every clock cycle.

The enabling of the RAS#[n], SEN#[n], and PRC#[n] signals is also controlled by a local access enable signal ACC#[n] and the local refresh enable signal REF[n]. The ACC#[n] signal is activated low when either the memory read enable signal Mrd or the memory write enable signal Mwr is asserted high and the bank activation signal BA[n] is asserted high. This logic function is implemented by OR gate 302 and NAND gate 311. As described below, a logic high Mrd signal indicates a memory read operation will be performed by one of memory banks 1000–1127. A logic high Mwr signal indicates a memory write operation will be performed by one of memory banks 1000–1127. The BA[n] signal is activated high when memory block [1000+n] is designated for external access or targeted for data retiring.

The local refresh enable signal REF[n] is activated high when there is a pending refresh (i.e., the refresh pending signal REFP[n] is high) and there is no pending access request to the memory block (i.e., the ACC#[n] signal is high). This logic function is implemented by AND gate 313. The high state of the REF[n] signal resets the output of S-R flip-flop 322 at next rising edge of the Clk signal, thereby canceling the pending refresh after a refresh operation has been performed.

The CAS#[n] signal is asserted low when the global CAS# signal is asserted low, either one of the Mrd or Mwr signals is activated high, and the bank access signal BA[n] is activated high. This logic function is implemented by inverter 301, OR gate 302 and NAND gate 312.

The local RAS#[n] signal is asserted low when the global RAS# signal is asserted low, a refresh operation is pending (i.e., refresh signal REFP[n] is asserted high), and there is no read or write access to memory block 1000 (i.e., the ACC#[n] signal is de-asserted high). This logical function is implemented by AND gates 313–314.

The local RAS#[n] signal is also asserted low when the global RAS# signal is asserted low, and a local access is pending (i.e, the ACC#[n] signal is asserted low). This logical function is implemented by NOR gates 331–332.

The local SEN#[n] signal is asserted low when the global SEN# signal is asserted low, a refresh operation is pending (i.e., refresh signal REFP[n] is asserted high), and there is no read or write access to memory block 1000 (i.e., the ACC#[n] signal is de-asserted high). The local SEN#[n] signal is also asserted low when the global PRC# signal and the ACC#[n] signal are asserted low. This logical function is implemented by AND gate 315 and NOR gates 333–334.

The local PRC#[n] signal is asserted low when the global PRC# signal is asserted low, a refresh operation is pending (i.e., refresh signal REFP[n] is asserted high), and there is no read or write access to memory block 1000 (i.e., the ACC#[n] signal is de-asserted high). The PRC#[n] signal is also asserted low when the global PRC# signal and the ACC#[n] signal are asserted low. This logical function is implemented by AND gate 316 and NOR gates 335–336.

Configuration of Write Buffer 110

Figure 4:
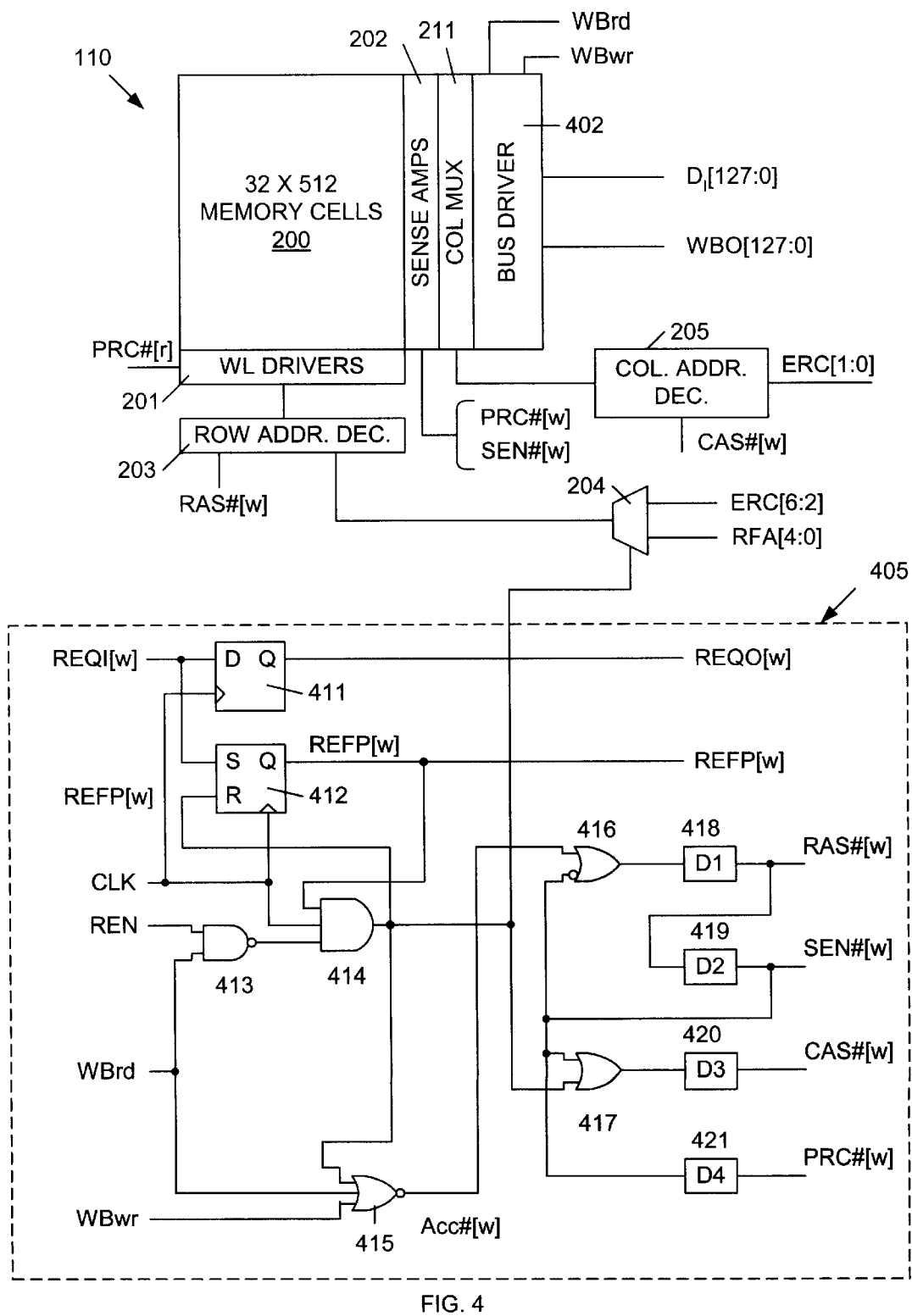
FIG. 4 is a block diagram of the write buffer of the 1-T SRAM system of FIG. 1 in accordance with one embodiment of the present invention.

FIG. 4 is a block diagram illustrating write buffer 110. Because write buffer 110 is similar to memory block 1000 (FIG. 2), similar elements in FIGS. 2 and 4 are labeled with similar reference numbers. Thus, write buffer 110 includes memory array 200, word line drivers 201, sense amplifiers 202, row address decoder 203, row address multiplexer 204 and column address decoder 205. Write buffer 110 also includes bus driver circuit 402 and write buffer controller 405. Write buffer controller 405 includes D-register 411, S-R register 412, NAND gate 413, AND gate 414, NOR gate 415, OR gates 416–417 and delay lines 418–421.

The operations of write buffer 110 (such as word line enable, sense amplifier enable, column switch enable and bit line pre-charge enable) are controlled by the local signals RAS#[w], SEN#[w], CAS#[w] and PRC#[w] generated by write buffer controller 405. These local signals function in a manner similar to local signals RAS# [n], SEN#[n], CAS# [n] and PRC#[n] described above. The notation [w] indicates that the signal is associated with write buffer 110. As described below, write buffer 110 is capable of handling one read cycle and one write cycle per clock cycle. Consequently, the local RAS#[w], SEN#[w], CAS#[w] and PRC#[w] signals can be activated and deactivated within a half clock period.

Bus driver circuit 402 operates in response to the write buffer read enable signal (WBrd) and the write buffer write enable signal (WBwr) to couple column multiplexer 211 to either data input bus DI[127:0] or write buffer output bus WBO[127:0]. A read access to write buffer 110 is carried out when the write buffer read enable signal (WBrd) is asserted. During a read access to write buffer 110, column multiplexer 211 is coupled to write buffer output bus WBO[127:0]. A write access to write buffer 110 is carried out when the write buffer write enable signal (WBwr) is asserted. During a write access to write buffer 110, column multiplexer 211 is coupled to data input bus DI [127:0].

Write buffer controller 405 operates as follows. D-register 411 and S-R register 412 are provided to enable refresh operations within write buffer 110. D-register 411 is coupled to receive input refresh request signal REQI[w] from memory block 1127. The rising edge of the Clk signal latches this input refresh signal, thereby providing an output refresh request signal REQO[w] (which is provided to read buffer 111). Registers 411 and 412 operate in the same manner as registers 321 and 322 (FIG. 3), thereby generating the write buffer refresh pending signal, REFP[w].

If the REFP[w], WBrd and WBwr signals are all de-asserted low, there is no access to write buffer 110. Under these conditions, AND gate 414 provides a logic low output signal and NOR gate 415 de-asserts the Acc#[w] signal high. The logic high Acc#[w] signal propagates through OR gate 416, and delay lines 418–419, thereby de-asserting the RAS#[w] and SEN#[w] signals high. The logic high SEN#[w] signal propagates through OR gate 417 and delay line 420, thereby de-asserting the CAS#[w] signal high. The logic high SEN#[w] signal also propagates through delay line 421, thereby de-asserting the PRC#[w] signal high.

When the REFP[w] signal is asserted high, a pending refresh operation is performed within write buffer 110, as long as there is no external read access that hits write buffer 110 (as indicated by logic high REN and WBrd signals). Under these conditions, NAND gate 413 provides a logic high output signal, such that AND gate 414 provides a logic high signal for the first half cycle of the CLK signal. The high output signal provided by AND gate 414 causes NOR gate 415 to drive the Acc#[w] signal low. In response, OR gate 416 provides a logic low signal, which propagates through delay lines 418, 419 and 421, thereby asserting the RAS#[w], SEN#[w] and PRC#[w] signals low, respectively. The logic low SEN#[w] signal causes OR gate 416 to provide a logic high output signal, which subsequently propagates through delay lines 418, 419 and 421, thereby de-asserting the RAS#[w], SEN#[w] and PRC#[w] signals high, respectively, in a self-timed manner. The delay values D1, D2 and D4 are selected such that the RAS#[w], SEN#[w] and PRC#[w] are de-asserted high before the falling edge of the CLK signal. Note that the logic high output signal provided by AND gate 414 causes OR gate 417 to provide a logic high signal to delay line 420. As a result, the CAS#[w] signal remains de-asserted high during the write buffer refresh operation. The logic high output signal provided by AND gate 414 also causes multiplexer 204 to route the refresh address RFA[4:0] to row address decoder 203. Finally, the logic high output signal provided by AND gate 414 resets S-R flip-flop 412, such that the REFP[w] signal is de-asserted low in response to the next rising edge of the Clk signal.

If an external read access hits write buffer 110, the REN and WBrd signals will have logic high values, thereby causing NAND gate 413 to provide a logic low value to AND gate 414. In this case, AND gate 414 is prevented from providing a logic high output signal and the refresh of write buffer 110 is delayed.

If there is no refresh pending in write buffer 110, the REFP#[w] signal will have a logic low value. In response, AND gate 414 provides a logic low output signal. As described in more detail below, the write buffer read signal WBrd can only be asserted during the first half cycle of the CLK signal and the write buffer write signal WBwr can only be asserted during the second half cycle of the CLK signal. If either the WBrd or the Wbwr signal is asserted high, NOR gate 415 will assert a logic low Acc#[w] signal. In response, OR gate 416 will provide a logic low output signal. This logic low value propagates through delay lines 418–421, thereby asserting the RAS#[w], SEN#[w], CAS#[w] and PRC#[w] signals, respectively. The logic low output signal provided by AND gate 414 allows OR gate 417 to transmit the logic low SEN#[w] signal to delay line 420. The logic low SEN#[w] signal causes OR gate 416 to provide a logic high signal to delay line 418. This logic high signal is propagated through delay lines 418-421, thereby de-asserting the RAS#[w], SEN#[w], CAS#[w] and PRC# [w] signals, respectively, in a self-timed manner. The delays D1–D4 are selected such that the access is complete in one half clock cycle.

When neither one of the WBrd nor WBwr signals is asserted high (and the REFP[w] signal is de-asserted low), the Acc#[w] signal is de-asserted high, thereby indicating that write buffer 110 is not being accessed. Under these conditions, the local RAS#[w], CAS#[w], SEN#[w] and PRC#[w] signals are all de-asserted high, thereby inhibiting access to write buffer 110.

Configuration of Read Buffer 111

Figure 5:
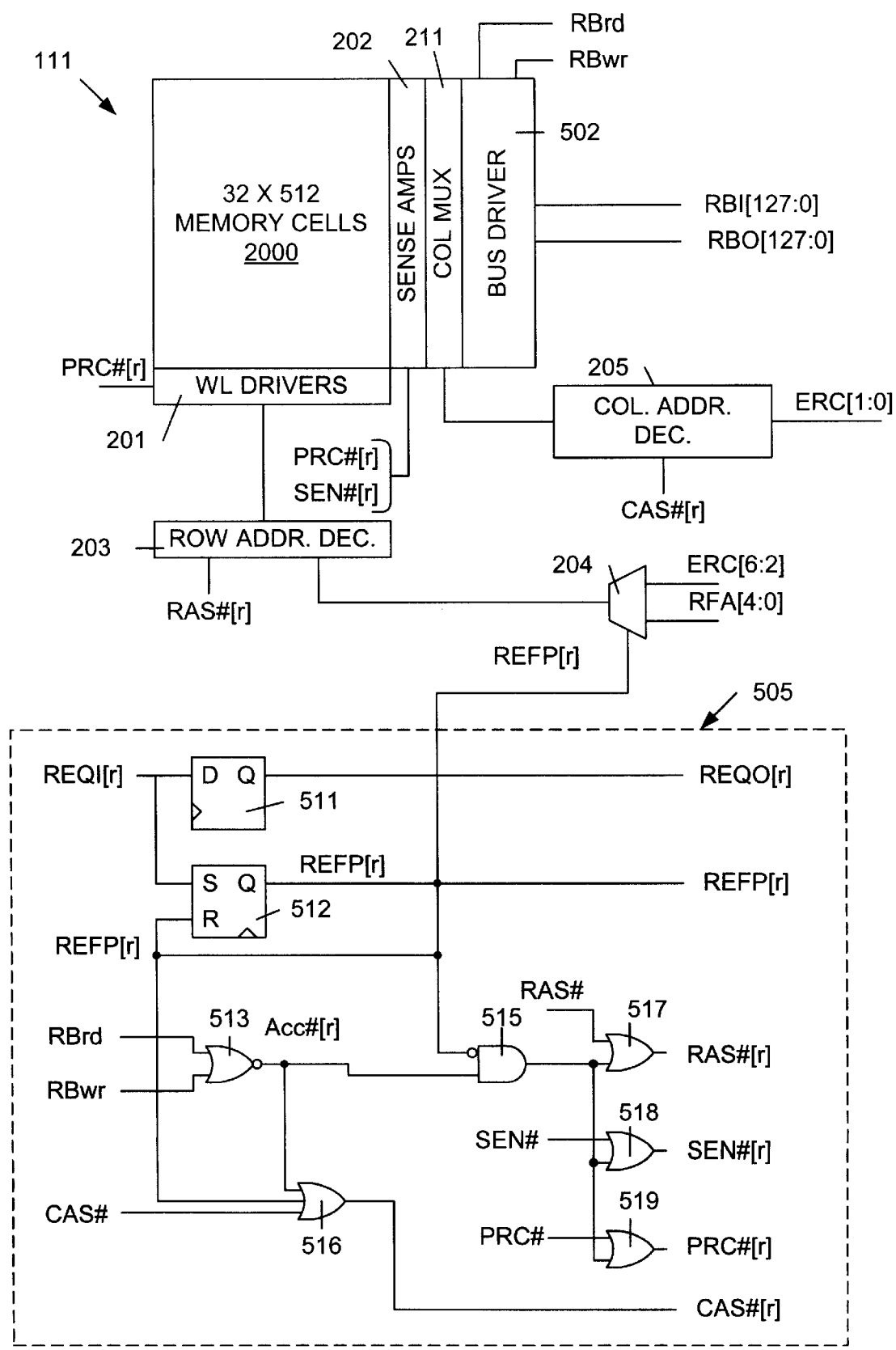
FIG. 5 is a block diagram of the read buffer of the 1-T SRAM system of FIG. 1 in accordance with one embodiment of the present invention.

FIG. 5 is a block diagram illustrating read buffer 111. Because read buffer 111 is similar to write buffer 110 (FIG. 4), similar elements in FIGS. 4 and 5 are labeled with similar reference numbers. Thus, read buffer 111 includes memory array 200, word line drivers 201, sense amplifiers 202, row address decoder 203, row address multiplexer 204 and column address decoder 205. Read buffer 110 also includes bus driver circuit 502 and write buffer controller 505. Write buffer controller 505 includes D-register 511, S-R register 512, NOR gate 513, AND gate 515 and OR gates 516–519.

Read buffer 111 operates in a manner similar to write buffer 110, but with signals specific to read buffer 111. Thus, bus driver 502 of read buffer 111 operates in response to the read buffer read enable signal RBrd and the read buffer write enable signal RBwr, which are asserted to couple column multiplexer 211 to read buffer output bus RBO[127:0] or read buffer input bus RBI[127:0], respectively. In addition, D-register 511 of read buffer 111 is coupled to receive the REQO[w] signal as input refresh request signal REQI[r]. Moreover, NOR gate 513 is coupled to receive the RBrd signal and the RBwr signal (as compared with NOR gate 413 in write buffer 110, which is coupled to receive the WBrd and WBwr signals). The notation "[r]" identifies the various signals as being associated with the read buffer. Note that read buffer refresh operations take priority over read and write accesses within read buffer 111.

Memory control unit 108

Figure 6:
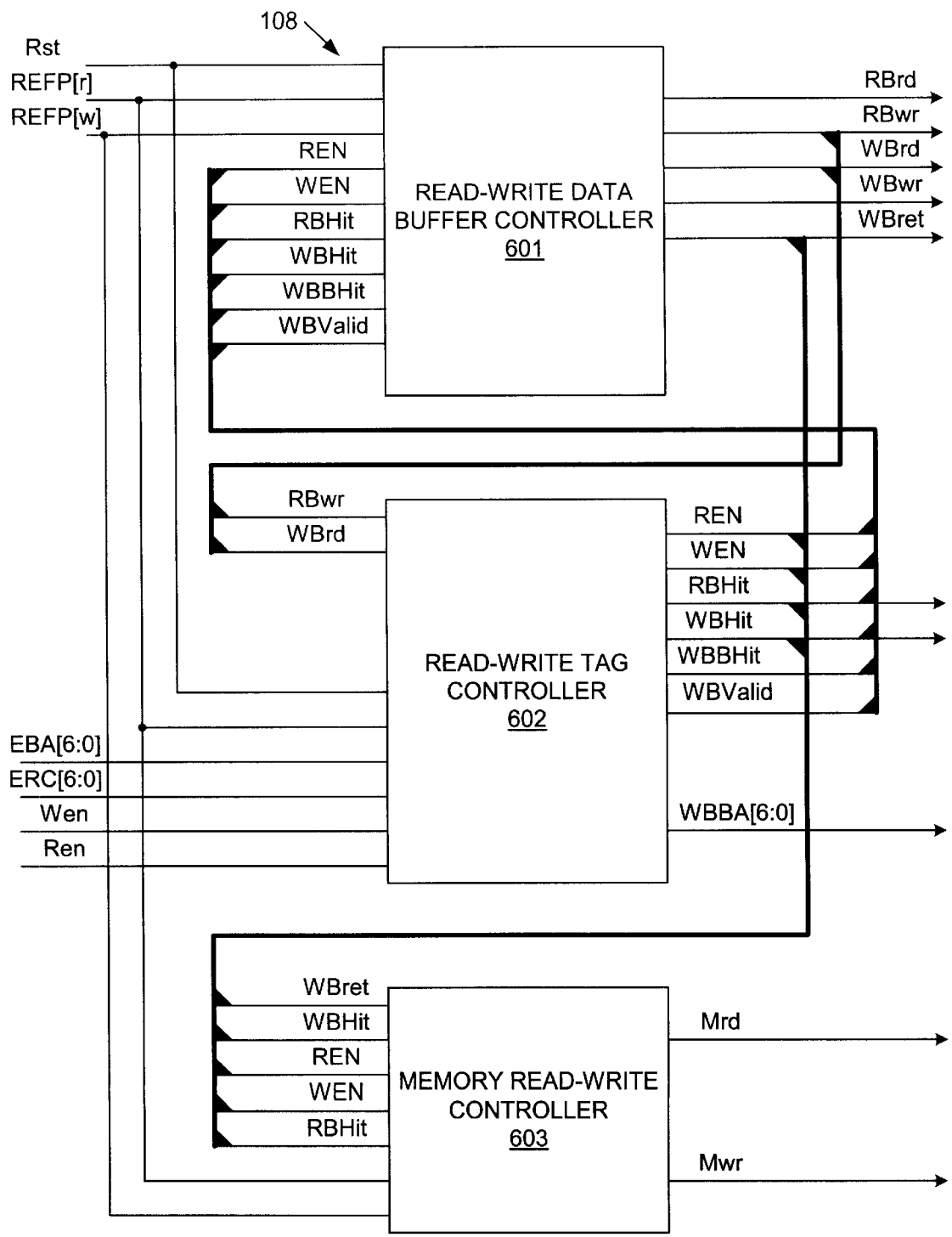
FIG. 6 is a block diagram of a memory control unit for the 1-T SRAM system of FIG. 1 in accordance with one embodiment of the present invention.

FIG. 6 is a block diagram of memory control unit 108 in accordance with one embodiment of the present invention. Memory control unit 108 includes read-write data buffer controller 601, read-write cache tag controller 602 and memory read-write controller 603. In general, read-write data buffer controller 601 is responsible for activating read and write accesses to write buffer 110 and read buffer 111. Read-write cache tag controller 602 is responsible for controlling the cache tag entries associated with write buffer 110 and read buffer 111. Memory read-write controller 603 is responsible for activating read and write accesses to memory blocks 1000–1127.

Memory control unit 108 operates in response to the following external signals: the global reset signal Rst, the external write enable signal Wen, the external read enable signal Ren, the external bank address signal EBA[6:0], and the external row-column address signal ERC[6:0]. In the described embodiment, in which write buffer 110 and read buffer 111 are constructed using DRAM cells, memory control unit 108 also receives read buffer refresh pending signal REFP[r] and write buffer refresh pending signal REFP[w] from read buffer 111 and write buffer 110, respectively.

FIG. 6 further illustrates the various control signals generated by read-write data buffer controller 601, read-write cache tag controller 602 and memory read-write controller 603. These control signals are described in more detail below.

Read/Write Cache Tag Controller 602

Figure 7:
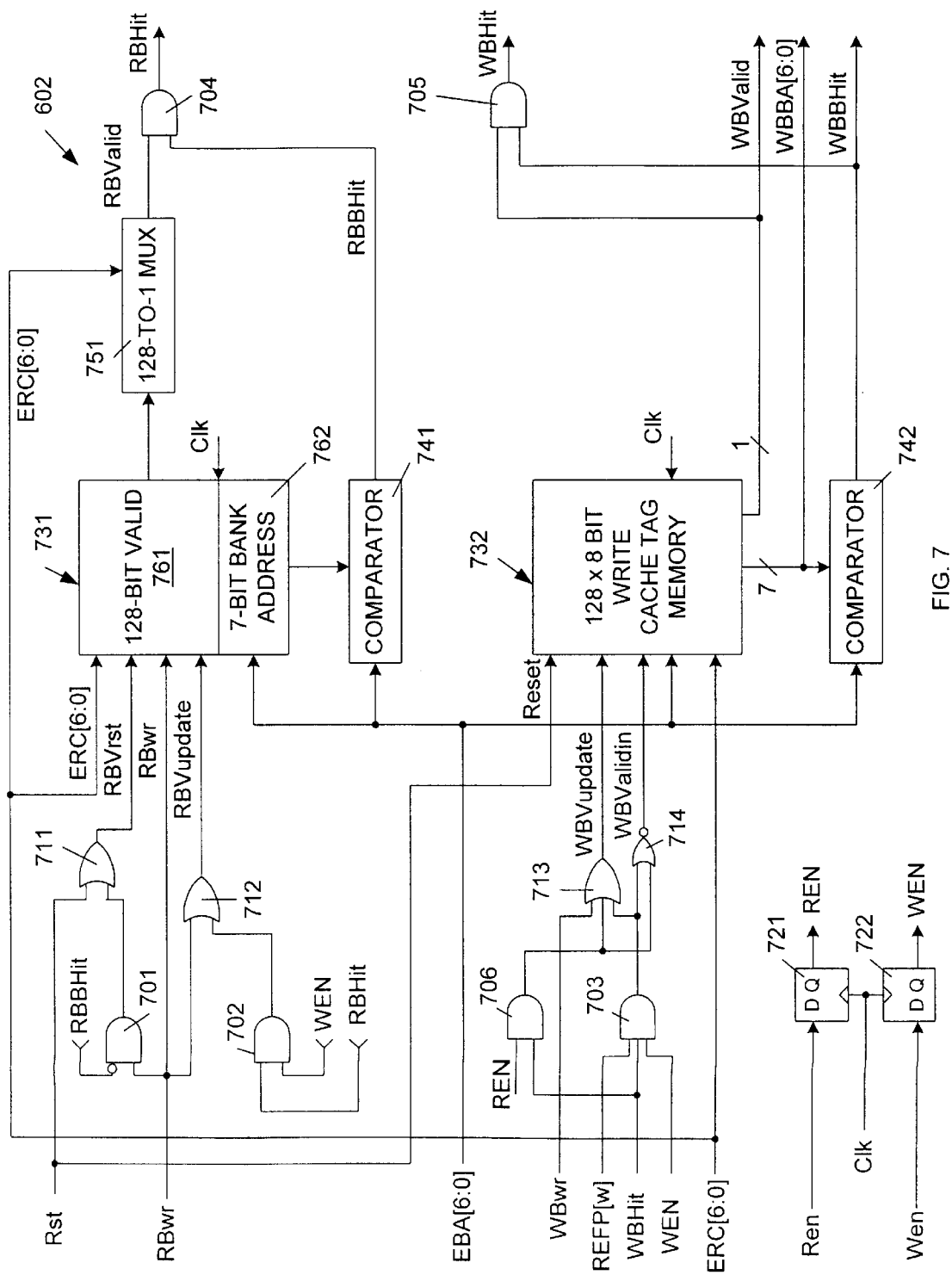
FIG. 7 is a circuit diagram of a read-write tag controller in accordance with one embodiment of the present invention.

FIG. 7 is a circuit diagram of read-write tag controller 602 in accordance with one embodiment of the present invention. Read-write cache tag controller 602 includes AND gates 701–706, OR gates 711–713, NOR gate 714, D-registers 721–722, read buffer cache tag memory 731, write buffer cache tag memory 732, comparators 741–742, and 128-to-1 multiplexer 751. Read buffer cache tag memory 731 includes a 128-bit read valid memory 761 and a 7-bit read bank address memory 762. Read valid memory 761 stores 128 read valid bits corresponding to the 128 entries of read buffer 111. Read bank address memory 762 stores the bank address associated with the valid entry or entries of read buffer 111.

Write buffer cache tag memory 732 is organized into 128 words of 8-bits per word. Bits [6:0] of each word contain the bank address for a corresponding entry in write buffer 110, and bit [7] of each word contains a valid bit, which when set, indicates that the data in the corresponding entry of write buffer 110 is valid.

The external read and write enable signals Ren and Wen are latched by D-registers 721 and 722 at rising edges of the Clk signal. In response, the D-registers 721 and 722 provide internal read enable signal REN and internal write enable signal WEN, respectively.

In general, read-write cache tag controller 602 generates a write buffer hit signal (WBHit) and a read buffer hit signal (RBHit) for controlling the operations of the write and read buffers 110–111, as well as memory banks 1000–1127.

Read Buffer Cache Tag Memory

The RBHit signal is generated as follows. Comparator 741 compares the external bank address EBA[6:0] with the read cache bank address stored in read bank address memory 762. If a match exists, comparator 741 provides a logic high read buffer bank hit signal RBBHit to AND gate 704.

The contents of read valid memory 761 are provided to 128-to-1 multiplexer 751 as a 128-bit signal RBV[127:0]. The external row-column address ERC[6:0] is provided to control multiplexer 751. In response, multiplexer 751 passes the read valid bit associated with the entry designated by the external row-column address. The selected valid bit is routed through multiplexer 751 as a read buffer valid signal (RBValid). An RBValid signal having a logic high value indicates that a corresponding word stored in read buffer 111 is valid. The RBBHit and RBValid signals are logically "ANDed" by AND gate 704, thereby generating the read buffer hit signal RBHit. A logic high RBHit signal indicates the occurrence of a read buffer hit. Conversely, a logic low RBHit signal indicates a read buffer miss.

The external row-column address ERC[6:0] is also provided to a decoder (not shown) in read buffer cache tag memory 731. In response, the decoder selects a corresponding one of the 128 bits in read valid memory 761 for setting or resetting during a read buffer update. The read buffer update is enabled by a logic high read buffer update signal (RBVupdate). The RBVupdate signal is asserted high when a read buffer write enable signal (RBwr) is asserted high. This logical function is implemented by OR gate 712. The RBVupdate signal is also asserted high when the write enable signal WEN and the read buffer hit signal RBHit are both asserted high. This logical function is carried out by AND gate 702 and OR gate 712. The generation of the read buffer write enable signal RBwr is described in more detail below in connection with read-write data buffer control 601.

All the valid bits in read valid memory 761 are reset to logic low values in response to a logic high read buffer reset signal (RBVrst). The RBVrst signal is asserted high when the external reset signal (Rst) is asserted high, or when a read access misses read buffer 111 (i.e., the RBBHit signal is low and the RBwr signal is high). These functions are implemented by AND gate 701 and OR gate 711. Read bank address memory 762 is updated with the external bank address EBA[6:0] when a read access misses read buffer 111 as indicated by a high state of the RBwr signal.

Write Buffer Cache Tag Memory

The WBHit signal is generated as follows. Write buffer 110 is organized as a direct-map write-data cache wherein each entry of write buffer 110 maps to a corresponding entry in one of memory banks 1000–1127, as identified by the row and column address. Each of the 128 entries in write buffer cache tag memory 732 contains two fields: one field containing a 7-bit bank address, and another field containing a 1-bit valid indicator. The 7-bit bank address field identifies the bank to which the corresponding data currently stored in write buffer 110 is to be written. A set (i.e., logic "1") valid bit in the valid field indicates that the data stored in the corresponding entry is valid. A reset (i.e., logic "0") valid bit indicates that the data stored in the corresponding entry is invalid. Write buffer 110 therefore operates as a direct-map write-only cache for memory blocks 1000–1127.

During an external access, the external row-column address ERC[6:0] is provided to write buffer cache tag memory 732. In response, write buffer cache tag memory 732 provides an entry corresponding with this row-column address ERC[6:0], wherein this entry includes a write buffer bank address WBBA[6:0] and a corresponding valid bit WBValid. If the WBBA[6:0] signal is valid, the WBValid signal is driven high. Comparator 742 compares the external bank address EBA[6:0] with the write buffer bank address WBBA[6:0] retrieved from write buffer cache tag memory 732. In case of a match, comparator 742 drives a write buffer bank hit signal WBBHit to a logic high state.

The WBBHit and WBValid signals are logically "ANDed" by AND gate 705, thereby generating the write buffer hit signal WBHit. A logic high WBHit signal indicates the occurrence of a write buffer hit. Conversely, a logic low WBHit signal indicates a write buffer miss. Note that the write buffer hit signal WBHit signal is driven high when the external bank address EBA[6:0] matches the corresponding bank address stored in write buffer tag memory 732, and the corresponding data stored in write buffer 110 is valid.

Write buffer cache tag memory 732 is updated when data is written to write buffer 110, as indicated by the high state of the write buffer write enable signal WBwr, or by the high states of the REFP[w], WEN and WBHit signals, which occur when a refresh is pending in write buffer 110 during a write access. In the former case, the bank address field of the tag entry associated with the external row-column address ERC[6:0] is overwritten with the bank address of the current write access. The corresponding valid bit of the entry is also set to the high state. In the latter case, the valid bit of the tag entry associated with row-column address ERC[6:0] is reset, indicating the data in this entry is invalid. This invalidation is required because a new data value is written directly to one of the memory blocks 1000–1127 when write buffer 110 is refreshed. As a result, the corresponding entry in write buffer 310 becomes outdated.

The write buffer tag is also updated when both the REN and WBHit signals are asserted high, indicating a read access that hits write buffer 110. In this case, the corresponding data in the write buffer is read and retired to the appropriate memory block and the write buffer entry is invalidated.

The update of write buffer 110 is enabled by a logic high write buffer update signal (WBVupdate). The WBVupdate signal is asserted high when the write buffer write enable signal (WBwr) is asserted high. This logical function is implemented by OR gate 713. In this case, the bank address field of the tag entry associated with the external row-column address ERC[6:0] is overwritten with the bank address of the current write access. The valid bit of the entry is also set to the high state. The generation of the write buffer write enable signal WBwr is described in more detail below in connection with read-write data buffer control 601.

The WBVupdate signal is also asserted high when the WEN signal, the WBHit and REFP[w] signals are all asserted high (i.e., when a refresh is pending in write buffer 110 during a write access). This logical function is carried out by AND gate 703 and OR gate 713. In this case, the valid bit of the tag entry associated with row-column address ERC[6:0] is reset, by writing the logic low state of the WBValidin signal to the corresponding valid bit entry in write buffer cache tag memory 732. This logic low valid bit indicates that the data in this entry is invalid. The logic low state of the WBValidin signal is provided by NOR gate 714 and AND gate 703 in response to the logic high WEN, WBHit and REFP[w] signals.

The WBVupdate signal is also asserted high when both the REN and WBHit signals are asserted high (i.e., when a read access hits write buffer 110). This logical function is carried out by AND gate 706 and OR Gate 713. In this case, the valid bit of the tag entry associated with row-column address ERC[6:0] is reset, by writing the logic low state of the WBValidin signal to the corresponding valid bit entry in write buffer cache tag memory 732. The logic low state of the WBValidin signal is provided by NOR gate 714 and AND gate 706 in response to the logic high REN and WBHit signals.

All the valid bits stored in write buffer cache tag memory 732 are reset to logic low values when the external reset signal (Rst) is asserted high.

Read buffer cache tag memory 731 and write buffer cache tag memory 732 are constructed using D-registers. The outputs of these registers are valid after the rising-edge of the Clk signal. This ensures that the updated values do not affect the operations occurring in the same clock cycle.

Read-Write Data Buffer Controller 601

Figure 8:
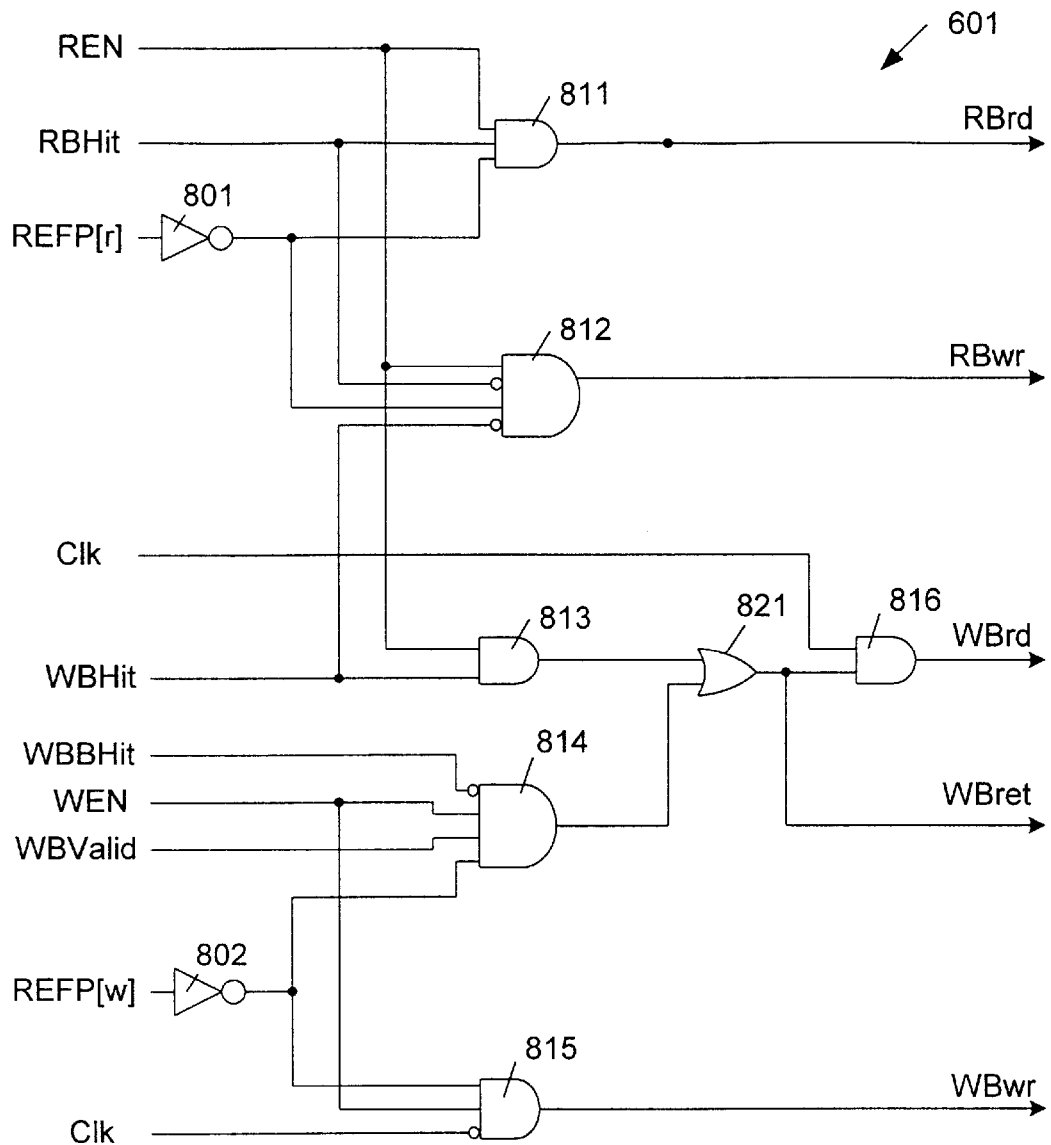
FIG. 8 is a circuit diagram of a read-write data buffer controller in accordance with one embodiment of the present invention.

FIG. 8 is a circuit diagram of read-write data buffer controller 601 in accordance with one embodiment of the present invention. Read-write data buffer controller 601 includes inverters 801–802, AND gates 811–816 and OR gate 821. In general, read-write data buffer controller 601 activates read and write accesses to write and read buffers 110–111. Read-write data buffer controller 601 receives the WBBHit, WBHit, RBHit, WBValid, WEN and REN signals generated by read-write cache tag controller 602, as well as the write buffer refresh signal REFP[w] and the read buffer refresh signal REFP[r]. Using these input signals, read-write data buffer controller 601 generates the read buffer read enable signal RBrd, the read buffer write enable signal RBwr, the write buffer read enable signal WBrd, the write buffer write enable signal WBwr, and the write buffer retire indicator signal WBret.

The read buffer read enable signal RBrd is asserted high when a read access hits read buffer 111 and there is no pending refresh to read buffer 111. That is, the RBrd signal is asserted high when both the RBhit and REN signals are high and the REFP[r] signal is low. This function is implemented by AND gate 811 and inverter 801.

The read buffer write enable signal RBwr is asserted high when a read access misses both read buffer 111 and write buffer 110 and there is no pending refresh to read buffer 111.

That is, the RBwr signal is asserted high when the internal read enable signal REN is high and the RBHit, WBHit and REFP[r] signals are low. This function is implemented by AND gate 812 and inverter 801.

The WBrd signal is asserted high when a read access hits write buffer 110. This condition is indicated by a logic high REN signal and a logic high WBHit signal. This logic function is implemented by AND gates 813 and 816, and OR gate 821. Note that the write buffer retiring signal WBret is provided by OR gate 821, such that the WBret signal is also asserted high when a read access hits write buffer 110.

The WBrd signal is also asserted high during a write allocation when the old valid data in write buffer 110 is retired to the corresponding one of memory blocks 1000–1127. Such condition is indicated by a logic low REFP[w] signal, a logic low WBBHit signal, a logic high WEN signal and a logic high WBValid signal. This logic function is implemented by inverter 802, AND gate 814, OR gate 821 and AND gate 816. Note that the write buffer retiring signal WBret is provided by OR gate 821, such that the WBret signal is also asserted high during a write allocation.

AND gate 816 is coupled to receive the output signal from OR gate 821 and the Clk signal. As a result, the WBrd signal can only be asserted when the Clk signal has a logic high state (e.g., during the first half of a clock cycle).

The write buffer write enable signal WBwr is asserted high during a write access when there is no pending refresh in write buffer 110. This condition is indicated by a logic high WEN signal and a logic low REFP[w] signal. This logic function is implemented by AND gate 815. AND gate 815 is also coupled to receive inverse of the Clk signal. As a result, the WBwr signal can only be asserted when the Clk signal has a logic low state (e.g., during the second half of a clock cycle).

Memory Read-Write Controller 603

Figure 9:
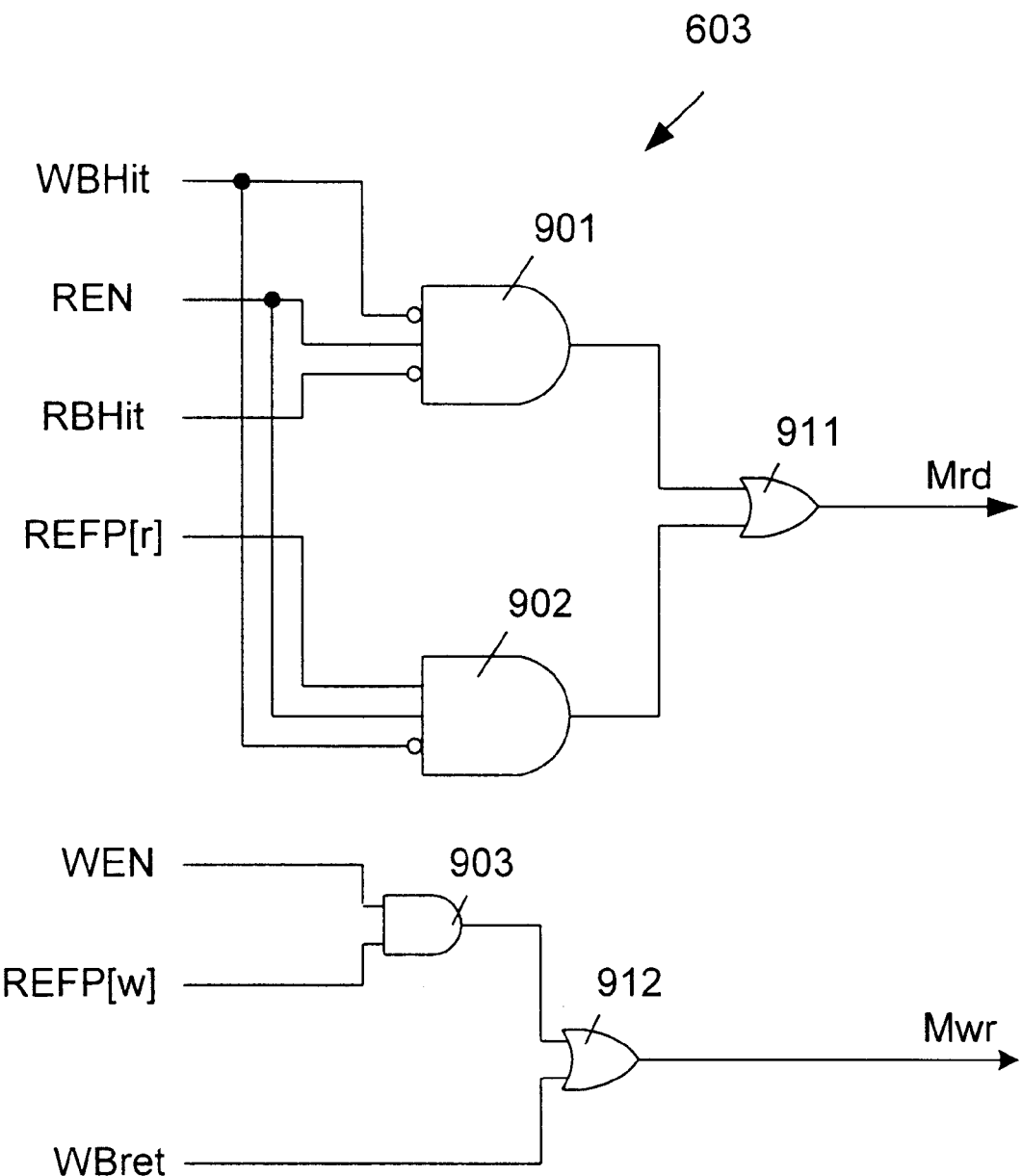
FIG. 9 is a circuit diagram of a memory read-write controller in accordance with one embodiment of the present invention.

FIG. 9 is a circuit diagram of memory read-write controller 603 in accordance with one embodiment of the present invention. Memory read-write controller 603 includes AND gates 901–903 and OR gates 911–912. Memory read-write control 603 is responsible for activating read and write accesses to memory blocks 1000–1127. These functions are accomplished by the generation of the memory read enable signal Mrd and memory write enable signal Mwr. Memory read enable signal Mrd, when activated, initiates a read cycle in one of memory blocks 1000–1127. Likewise, memory write enable signal Mwr, when activated, initiates a write cycle in one of memory blocks 1000–1127.

A memory read operation is performed when a read access misses both write buffer 110 and read buffer 111. That is, a memory read operation is performed (i.e., the Mrd signal is activated) when the WBHit and RBHit signals are both low and the REN signal is high. This logic function is implemented by AND gate 901 and OR gate 911.

A memory read operation is also performed when a read access misses write buffer 110 and there is a refresh pending in read buffer 111. That is, a memory read operation is performed (i.e., the Mrd signal is activated) when the REN and REFP[r] signals are high and the WBHit signal is low. This logic function is implemented by AND gate 902 and OR gate 911.

A memory write operation is performed when an entry of write buffer 110 is retired from write buffer 110 to one of memory blocks 1000–1127, or when a write access occurs and a refresh is pending in write buffer 110. That is, a memory write operation is performed (i.e., the Mwr signal is activated) when the WEN and REFP[w] signals are activated high, or when the WBret signal is asserted high. This logic function is implemented by AND gate 902 and OR gate 911.

Operation of Memory System 100

The operation of memory system 100 will now be described. Memory control unit 108 (FIGS. 1, 6–9) controls the accessing and refreshing of the memory cells such that refreshing of the memory cells does not interfere with any external access of the memory cells.

In the present example, the proper refresh period is equal to the time between two activations of the RFREQ signal, or 1 msec. A refresh operation of a memory bank can be completed within one cycle of the Clk signal. If a memory bank has at least one clock cycle during the proper refresh period during which the memory bank is not accessed, then the memory bank can fulfill the refresh obligation by using this idle cycle to perform a refresh operation. An idle cycle in a memory bank is created when there is no external access, or when an external access hits another bank. Therefore, if the external access switches banks at least once within a proper refresh period, then all the memory banks can be refreshed properly. As described in more detail below, memory control unit 108, write buffer 110 and read buffer 111 ensure that at least one idle memory cycle is provided during the proper refresh period for a bank that is accessed continuously during a proper refresh period.

Read Buffer

Figure 10:
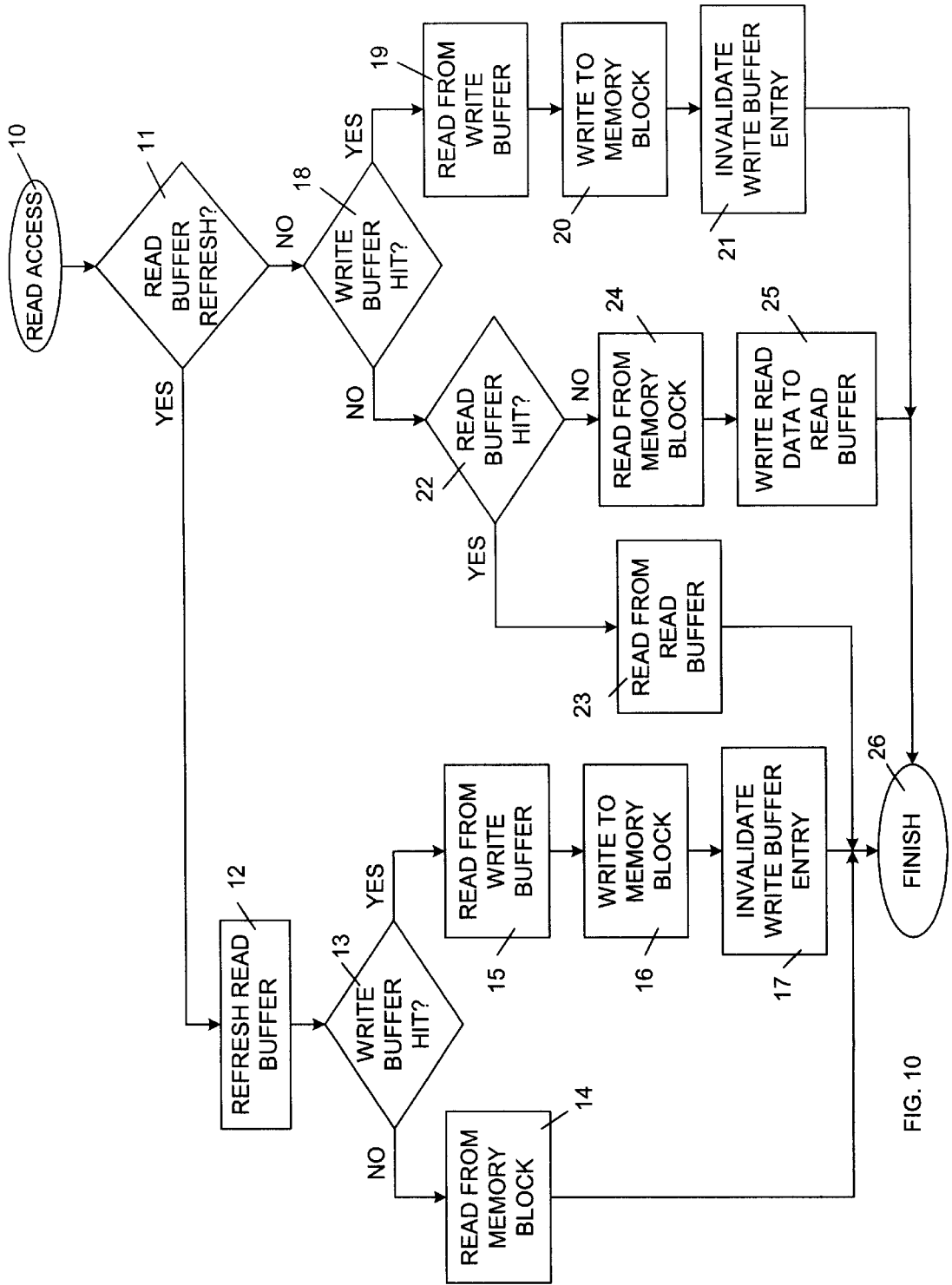
FIG. 10 is a flow diagram of read accesses of the 1-T SRAM system of FIG. 1.

FIG. 10 is a flow diagram illustrating the possible read access operations in the described embodiment. A read access is initiated in Step 10. If a read buffer refresh operation is pending at this time (Step 11, YES branch), then read buffer 111 is refreshed (Step 12). If the read access does not hit write buffer 110 (Step 13, NO branch), then the desired data value is read from the memory block 1000–1127 identified by the external address (Step 14), thereby completing the read access (Step 26). If the read access hits write buffer 110 (Step 13, YES branch), then the desired data value is read from write buffer 110 (Step 15). In addition, the desired data value read from write buffer 110 is written to the memory block identified by the external address (Step 16), and the corresponding entry of write buffer cache tag memory 732 is invalidated (Step 17), thereby completing the read access (Step 26).

If a read buffer refresh operation is not pending (Step 11, NO branch), and the read access hits write buffer 110 (Step 18, YES branch), then the desired data value is read from write buffer 110 (Step 19). In addition, the desired data value read from write buffer 110 is written to the memory block identified by the external address (Step 20), and the corresponding entry of write buffer cache tag memory 732 is invalidated (Step 21), thereby completing the read access (Step 26).

If a read buffer refresh operation is not pending (Step 11, NO branch), the read access does not hit write buffer 110 (Step 18, NO branch), and the read access hits read buffer (Step 22, YES branch), then the desired data value is read from read buffer (Step 23), thereby completing the read access (Step 26).

If a read buffer refresh operation is not pending (Step 11, NO branch), the read access does not hit write buffer 110 (Step 18, NO branch), and the read access misses read buffer (Step 22, NO branch), then the desired data value is read from the addressed memory block (Step 24) and written to read buffer 111 (Step 25), thereby completing the read access (Step 26).

As described above, a single read buffer cache tag memory 731 having two fields is used to keep track of the data stored in read buffer 111. One of the two fields is a 7-bit bank address field that identifies the bank that provided the data currently stored in read buffer 111 (See, element 762, FIG. 7). The other field is a 128-bit valid field that stores a 1-bit valid bit for each of the 128 entries of read buffer 111 (See, element 761, FIG. 7). A set (i.e., logic "1") valid bit in the valid field indicates that the data stored in the corresponding entry is valid. A reset (i.e., logic "0") valid bit indicates that the data stored in the corresponding entry is invalid. Thus, read buffer 111 acts like a shadow of the memory bank being accessed. If a read or write access occurs to a bank having an address different from the one contained in the bank address field of the read buffer cache tag, then the bank address field of the read buffer cache tag is updated to reflect this different bank address. In addition, all the valid bits in the valid field are reset, except for the valid bit associated with the new entry. The valid bit associated with the new entry is set and the read data is written to the corresponding entry of read buffer 111.

In the worst case, a single memory bank is continuously subjected to read accesses. If one of these read accesses hits read buffer 111 during a proper refresh period, an idle cycle is created in the memory bank that read buffer 111 is shadowing. This memory bank can be refreshed during this idle cycle. If the continuous read accesses miss read buffer 111, then data will be accumulated in read buffer 111. In the worst case, the read accesses traverse the entire address space of the single memory bank, such that the read buffer completely shadows the entire contents of the single memory bank (i.e., read buffer 111 stores an identical copy of the data in the single memory bank). Under this circumstance, read buffer 111 is filled in 128 clock cycles. At this time, another read access to the same memory bank necessarily results in a read buffer hit. Because the proper refresh period of 1 msec is longer than the read buffer fill period of 128 clock cycles, the read buffer hit creates an idle cycle for the single memory bank. During this idle cycle, the single memory bank is refreshed.

To ensure proper refresh in read buffer 111, refresh operations take precedence over external access operations. Therefore, when a refresh operation is pending, read buffer 111 ignores all external accesses to perform the pending refresh operation. When a refresh is pending in read buffer 111, the refresh pending signal REFP[r] is asserted high. The REFP[r] signal is used in read-write buffer controller 601 to suppress the activation of the read buffer read enable signal RBrd and the read buffer write enable signal RBwr. (See, AND gates 811–812, FIG. 8.) When the REFP[r] signal is driven high, outputs of AND gates 811–812 are driven low, thereby causing the RBrd and RBwr signals to go low. When read buffer ill is busy performing a refresh operation, the designated memory bank or write buffer 110 has to handle the read access.

Write Buffer

Figure 11:
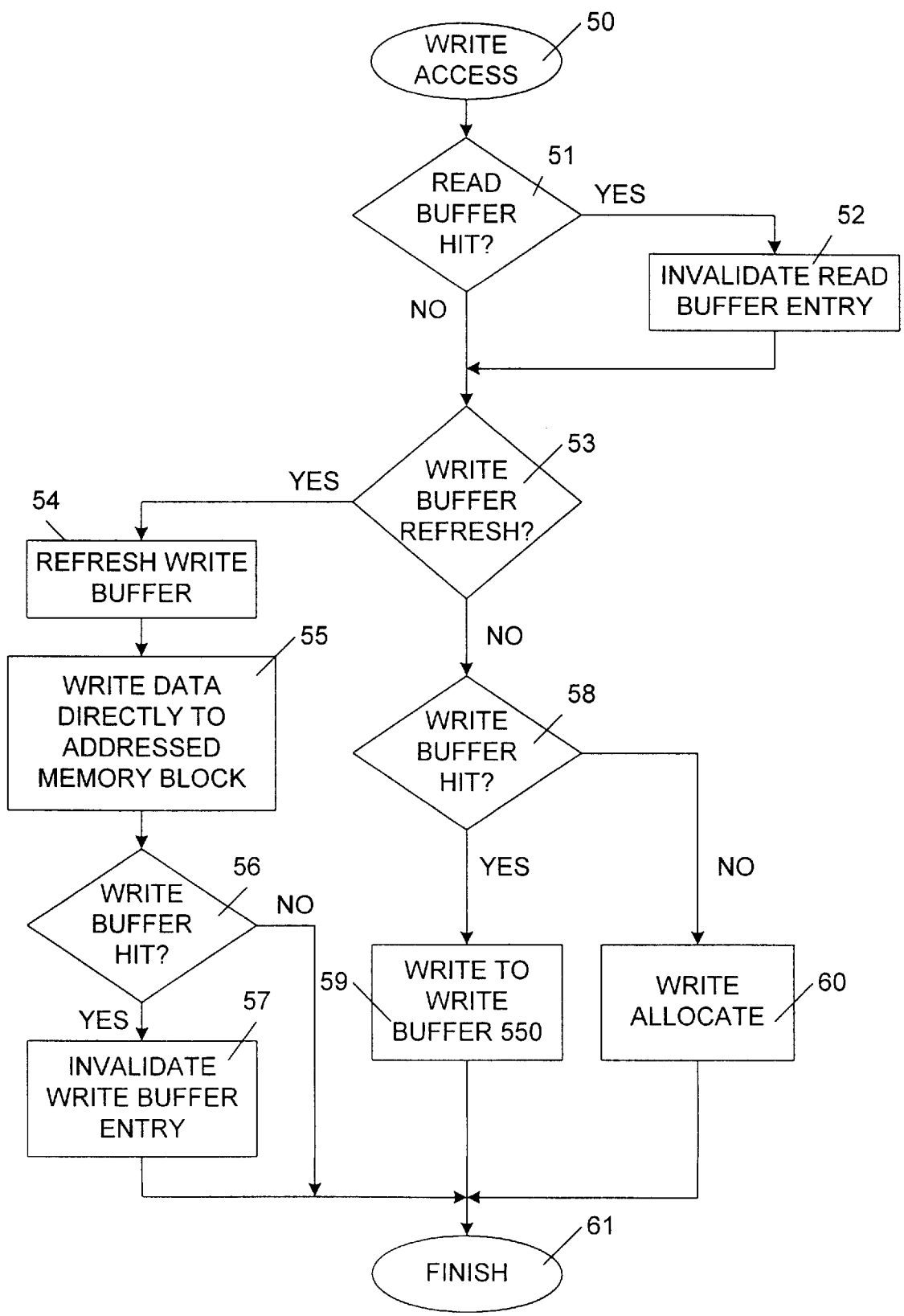
FIG. 11 is a flow diagram of write accesses of the 1-T SRAM system of FIG. 1.

FIG. 11 is a flow diagram illustrating the possible write access operations in the described embodiment. A write access is initiated in Step 50. If the write access hits read buffer 111 (Step 51), then the corresponding valid bit of the 128-bit read buffer valid field 761 is reset (Step 52).

If a write buffer refresh is pending (Step 53, YES branch), then write buffer 110 is refreshed (Step 54), and the external write data value is also written directly to the memory block identified by the external address EBA[6:0] (Step 55). If the write access does not hit write buffer 110 (i.e., WBHit="0") (Step 56, NO branch), then the write access is complete (Step 61). If the write access hits write buffer 110 (i.e., WBHit="1") (Step 56, YES branch), then the valid bit of the corresponding entry in write buffer cache memory 732 is reset, thereby invalidating this entry, and completing the write access (Step 61).

If a write buffer refresh is not pending (Step 53, NO branch) and the write access hits write buffer 110 (i.e., WBHit="1") (Step 58, YES branch), then the data value of the current write access is written to the entry of write buffer 110 corresponding with the external row-column address, thereby overwriting the previous data value at this location (Step 59). In addition, the external bank address is written to the bank address entry of write buffer cache tag memory 732 corresponding with the external row-column address, and the associated valid bit is set (Step 59). At this time the current write access is complete (Step 61).

If a write buffer refresh is not pending (Step 53, NO branch) and the write access misses write buffer 110 (i.e., WBHit="0") (Step 58, NO branch), then a write allocate operation is performed (Step 60). In the write allocate operation, a valid data value stored in the entry of write buffer 110 corresponding with the external row-column address is read from write buffer 110 during a first half of a clock cycle. This data value is written to the memory bank identified in the corresponding bank address entry of write buffer cache tag memory 732. Note that the external row-column address is used to perform this write operation. Also note that an invalid data value stored in write buffer 110 will not be written to the memory block. During the second half of the clock cycle, the data value of the current write access is written to the entry of write buffer 110 corresponding with the external row-column address, and the external bank address is written to the bank address entry of write buffer cache tag memory 732 corresponding with the external row-column address. At this time, the current write access is complete (Step 61).

As described above, during write allocation, data is read out of write buffer 110 and retired to the addressed memory bank before the write data is written to write buffer 110. During write allocation, write buffer 110 is required to perform a read operation and a write operation within one data cycle, or, in the present embodiment, within one clock cycle. During write allocation, data retiring has priority over pending refresh operations in memory banks 1000–1127. That is, during write allocation, if the memory bank to which data is being retired (written) has a pending refresh, the refresh operation is deferred until after data has been retired (written) to the memory bank.

As also described above, the refresh of write buffer 110 has priority over a write access to write buffer 110. The refresh of write buffer 110 also has priority over refresh operations in memory banks 1000–1127. Thus, if a write access occurs when both the designated memory bank and write buffer 110 have pending refresh operations, the refresh operation in the designated memory bank is deferred so the write operation can be handled by the designated memory bank.

However, if a read operation results in a hit to write buffer 110, then this read operation has priority over a refresh operation to write buffer 110. The refresh operation to write buffer 110 therefore adds another clock cycle requirement on the proper refresh period. To avoid the case where write buffer 110 is continuously hit by read accesses, thereby repeatedly causing the refresh operation in write buffer 110 to be delayed, when a read access hits write buffer 110 and misses read buffer 111, data is read out from write buffer 110 for output. This data is also written to the addressed memory block, and the corresponding write buffer entry is invalidated.

Write Data Coherence

Write data coherence in memory banks 1000–1127 is maintained by the valid field in write buffer cache tag memory 732, so that valid data in write buffer 110 is retired to memory banks 1000–1127 during write allocation. Write data coherence in read buffer 111 is maintained by invalidating the corresponding read buffer entry when a write access hits read buffer 111. In an alternative embodiment, the write data coherence in read buffer 111 is maintained by updating the data in read buffer 111 during a write access which hits read buffer 111.

Minimum proper refresh period

The actual minimum proper refresh period in the worst-case scenario is 258 clock cycles. This occurs when all the entries of write buffer 110 contains valid data for a first memory bank and a write sequence occurs which traverses all of the addresses of a second memory bank. This write sequence is then followed by a read sequence to the first memory bank which traverses all of the addresses of the first memory bank. This access scenario requires the first memory bank to be accessed consecutively for 256 cycles with 128 cycles for write allocation and 128 cycles for read buffer miss. A pending refresh in the first memory bank at the beginning of this worst-case access scenario does not get serviced until all 256 cycles later. At the end of the 256 clock cycles, an access to another bank occurs, a read hit occurs, or in the case of a write access to the first bank, a write allocation to the second bank occurs. Any of these cases allows a memory idle cycle to occur in the first memory bank, thereby allowing the pending refresh to be performed by the first memory bank. If the read and write buffer refresh both occur during the 256 clock cycles, the memory refresh in the first memory bank is further delayed by two more clock cycles, making the minimum proper refresh period to be 258 clock cycles.

The structure and operation of the various elements of memory system 100 will now be described in more detail.

Read access timing

Figure 12:
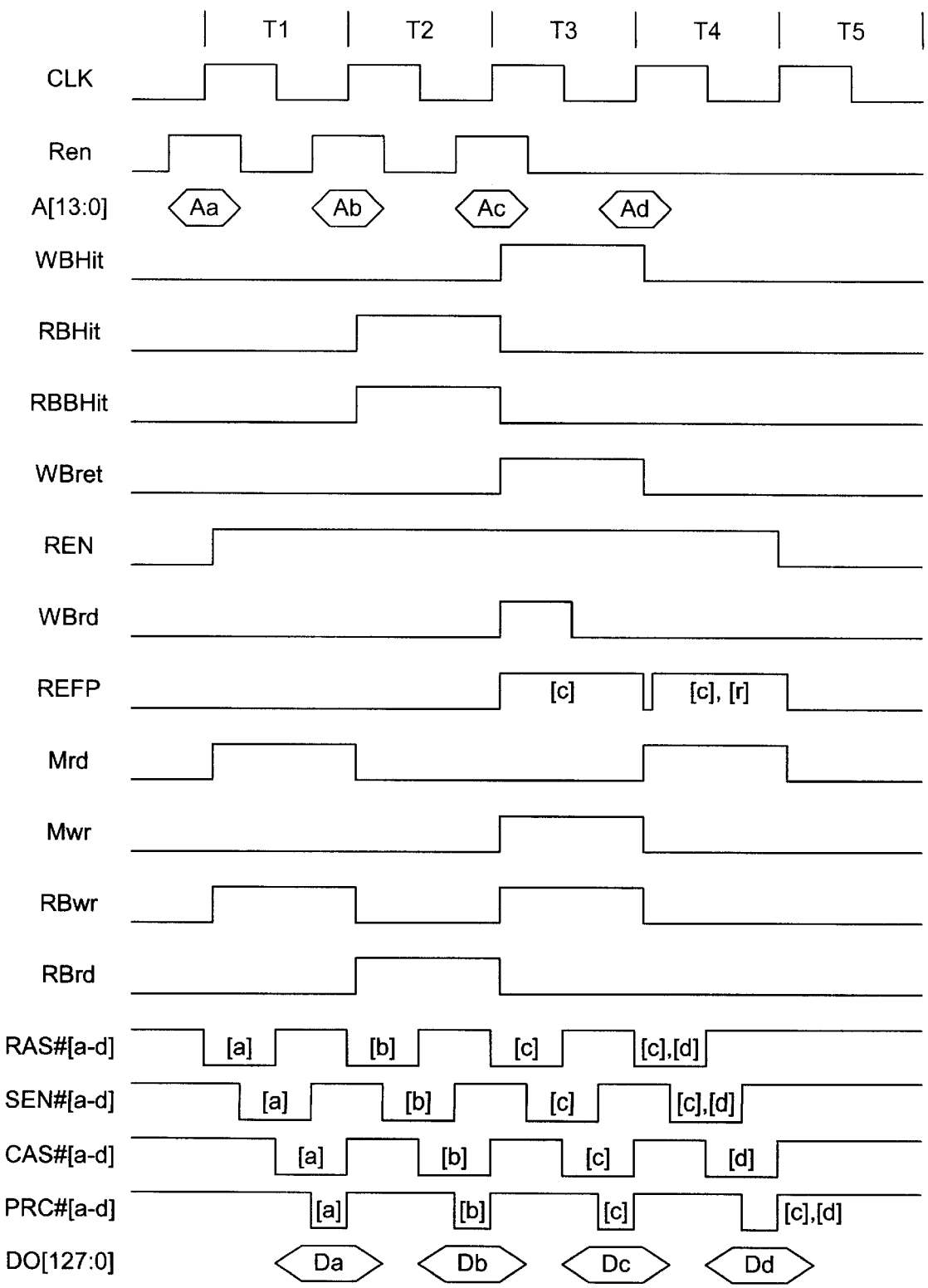
FIG. 12 is a waveform diagram illustrating control signal timing during three different read accesses to the 1-T SRAM system of FIG. 1 in accordance with one embodiment of the present invention.

FIG. 12 is a waveform diagram illustrating the timing of the control signals during four different memory read accesses. The first read access, having external address Aa, illustrates the case of a read buffer miss and write buffer miss when there is no pending refresh. The second read access, having external address Ab, illustrates the case of a read buffer hit. The third read access, with external address Ac, illustrates the case of a read buffer miss and a write buffer hit. The fourth read access, with external address Ad, illustrates the case of a refresh of read buffer 111 during a read access that misses write buffer 110. It is noted that these four accesses need not (and might not) necessarily occur in this order during normal operation of memory system 100, but are shown for illustrative purposes.

In the first read access, the external read enable signal Ren is asserted high. The logic high state of the Ren signal is detected and latched in D-register 721 (FIG. 3) at the rising edge of clock cycle T1. The external access address Aa[13:0] is latched in address register 104 (FIG. 1) at the rising edge of clock cycle T1. The bank address Aa[13:7] (i.e., EBA [6:0]) is gated to bank address decoder 105 (FIG. 1), comparators 741–742 and the read and write buffer cache tag memories 731 and 732 in read-write tag controller 602 (FIG. 3).

Bank address decoder 105 activates the bank access signal BA[a] by driving the corresponding external bank-select signal EBS[a] high, where 'a' is the bank corresponding with address Aa[13:7]. Within read-write tag controller 602, comparator 741 compares bank address Aa[13:7] with the read buffer tag stored in read cache memory 762. Because there is no hit, comparator 741 provides a logic low RBBHit signal, thereby resulting in a logic low RBHit signal. Similarly, comparator 742 compares bank address Aa[13:7] with the write buffer tag stored at the address corresponding with the row-column address Aa[6:0] in write buffer cache tag memory 732. Because there is no hit, comparator 742 provides a logic low WBBHit signal.

The read buffer write enable signal RBwr is asserted high in response to the low state of the RBHit signal, the low state of the REFP[r] signal, and the high state of the REN signal. (See, AND gate 812, FIG. 8.) The memory read enable signal Mrd is also asserted high in response to the logic low RBHit, REFP[r] and WBHit signals and the logic high REN signal. (See, AND gate 901, FIG. 9.)

The write buffer read enable signal WBrd is de-asserted low in response to the logic low WBHit and WEN signals. (See, AND gates 813–814 and 816, FIG. 8). The low WBrd signal causes multiplexer 115 to route the EBS[127:0] signal provided by bank address decoder 105 to memory blocks 1000–1127 as the BA[127:0] signal. [0135] Memory sequencer 103 generates the global memory timing signals RAS#, SEN#, CAS# and PRC# in response to the rising edge of the Clk signal. In the addressed memory block [a], the logic high BA[a] and Mrd signals cause the local access enable signal ACC#[a] to be asserted low. (See, OR gate 302 and NAND gate 311, FIG. 3.) The low state of the ACC#[a] signal causes the local refresh signal REF[a] to have a logic low value. (See, AND gate 313, FIG. 3.) The logic low ACC#[a] and REF[a] signals enable the memory bank timing control signals RAS#[a], SEN#[a], CAS#[a], and PRC#[a] to be activated by the corresponding global signals RAS#, SEN#, CAS# and PRC#.

Activation of the RAS#[a] signal activates the row address decoder 203 (FIG. 2) and subsequently activates the word line designated by the row address Aa[6:2] (i.e., ERC[6:2]) causing data stored in the designated row of the memory array to be loaded to the bit lines. Activation of the SEN#[a] signal latches the data in the bit line in sense amplifiers 202. Activation of the CAS#[a] signal enables column address decoder 205, the output of which selects the 128-bit word designated by the column address in Aa[1:0] (i.e., ERC[1:0]) for output to read-write port 112. The data value Da[127:0] is then driven from read-write port 112 to read/write port output bus RWPO[127:0]. Output multiplexer 109 passes this data value Da to output data bus DO[127:0] in response to the logic low WBHit, RBHit and REFP[r] signals.

Because the first read access misses both write buffer 110 and read buffer 111, the WBHit signal and the RBHit signal are both low. In response, output multiplexer 114 routes the data on read-write port output bus RWPO[127:0] to read buffer 111. In read buffer 111, the high state of the read buffer write enable signal RBwr causes the data to be written to the location designated by the address Aa[6:0] (i.e., ERC[6:0]) at the end of the clock cycle T1. (See, FIG. 5).

In read-write buffer tag controller 602 (FIG. 7), the high state of the RBwr signal causes the bank address Aa[6:0] (i.e., EBA[6:0]) to be written to the read buffer tag memory 762. The high state of the RBwr signal and the low state of the RBBHit signal cause all of the valid bits, except the one designated by the address in Aa[6:0], to be reset. The valid bit associated with the address Aa[6:0] is set (updated) to a logic '1' value.

The second read access to address Ab[13:0] is detected at the rising edge of the Clk signal at the beginning of cycle T2. The high state of the external Ren signal is latched by D-register 721 (FIG. 7), thereby driving the local read enable signal REN high. The second read access hits read buffer 111. Therefore, at the beginning of clock cycle T2, read comparator 741 detects a match between the current bank address Ab[13:7] (i.e., EBA[6:0]) and the cached bank address stored in read cache tag memory 762 (i.e., Aa[6:0]). In response, comparator 741 drives the RBBHit signal high. Row-column address Ab[6:0] also causes 128-to-1 multiplexer 751 to route the logic '1' valid bit stored in read valid bit memory 761 as the RBValid signal. As a result, the read buffer hit signal RBHit is driven high. (See, AND gate 704).

Within read-write data buffer controller 601 (FIG. 8), the logic high REN and RBHit signals and the logic low REFP[r] signal activate the read buffer read enable signal RBrd and cause a read operation to be carried out in read buffer 111. The data value Db designated by address Ab[6:0] is read out from read buffer 111 to read buffer output bus RBO[127:0]. The high state of the RBHit signal and the low state of the WBHit and REFP[r] signals causes output multiplexer 109 to route the data on output bus RBO[127:0] to the output data bus DO[127:0]. In memory read-write control 603, the memory bank read signal Mrd is driven low because of the high state of the RBHit signal (See, AND gate 901, FIG. 5). As a result, the memory blocks 1000–1127 do not perform any operations for the second read access. If there are refresh operations pending in any of memory blocks 1000–1127 during clock cycle T2, then these refresh operations are performed during clock cycle T2.

The third read access to address Ac[13:0] is detected at the rising edge of the Clk signal at the beginning of cycle T3. The high state of the external Ren signal is latched by D-register 721 (FIG. 7), thereby driving the local read enable signal REN high. The third read access misses read buffer 111 and hits write buffer 110. At the beginning of clock cycle T3, the read access is detected, and the external access address Ac[13:0] of the third read access is latched into address register 104 (FIG. 1). In the described example, the external bank address Ac[13:7] does not match the read cache tag stored in read cache memory 762. As a result, comparator 741 drives the RBBHit signal (and thereby the RBHit signal) to a logic low state. The external bank address Ac[13:7] matches the bank address entry of write buffer cache tag memory 732 that is designated by the row/column address Ac[6:0]. As a result, comparator 742 drives the WBBHit signal to logic high value. In the described example, the valid entry bit associated with the bank address entry retrieved from write buffer cache tag memory 732 is set (i.e., WBValid="1"). Consequently, the WBHit signal is asserted high (See, AND gate 705, FIG. 7). The high state of the WBHit signal de-activates the read buffer write enable RBwr signal. (See, AND gate 812, FIG. 8.) The low state of the RBHit signal de-activates the read buffer read enable signal RBrd. (See, AND gate 811, FIG. 8.)

Similarly, the high states of the WBHit and REN signals activate the write buffer read enable WBrd signal during the first half of clock cycle T3. (See, AND gates 813, 816 and OR gate 821, FIG. 8). The high states of the WBHit and REN signals also activate the write buffer retire WBret signal. (See, AND gate 813 and OR gate 821, FIG. 8.) The activation of the WBrd signal causes a read operation to be carried out in write buffer 110. The data value Dc is read from the entry of write buffer designated by the row-column address Ac[6:0]. This data value Dc is provided on write buffer output bus WBO[127:0]. Multiplexer 109 passes the data value DC to output data bus DO[127:0] in response to the logic high WBHit signal, the logic low RBHit signal and the logic low REFP[r] signal.

In addition, the logic high WBret signal causes the Mwr signal to be asserted high. (See, OR gate 912, FIG. 9.) The logic high WBret signal also causes multiplexer 113 to pass the data value Dc to the memory read/write port 112 in response to the logic high WBret signal. The high state of the Mwr signal causes the data value Dc provided to memory read/write port 112 to be written to the memory bank designated by the bank address Ac[13:7], at the word designated by the row-column address Ac[6:0].

Moreover, the logic high REN and WBHit signals cause AND gate 706 to assert a logic high output signal to OR gate 713 and NOR gate 714 (FIG. 7). As a result, the WBVupdate signal is asserted high, and the WBValidin signal is de-asserted low. Under these conditions, the valid bit of the write buffer entry in cache tag memory 732 is reset, effectively invalidating this write buffer entry.

Note that the logic high WBHit signal causes the memory read enable signal Mrd to be de-asserted low (AND gates 901–902, FIG. 9).

The memory bank addressed by external address Ac[13:0] is designated as memory bank [c]. As illustrated by the asserted refresh pending signal REFP[c] in FIG. 12, a refresh request is detected in memory bank [c] during clock cycle T3. However, the high states of the refresh pending signal REFP[c] and the Mwr signal cause the internal refresh signal REF[c] to stay low thereby delaying the refresh operation in memory bank [c]. (See, FIG. 3). The low state of the refresh signal REF[c] prevents the memory array timing signals RAS#[c], SEN#[c] and PRC#[c] from being triggered by the corresponding global timing signals RAS#, SEN# and PRC# generated by memory sequencer 103 (FIG. 1).

The fourth read access to address Ad[13:0] is detected at the rising edge of the Clk signal at the beginning of cycle T4. The high state of the external Ren signal is latched by D-register 721 (FIG. 7), thereby driving the local read enable signal REN high. As illustrated by the asserted refresh pending signal REFP[r] in FIG. 12, a refresh request is detected in read buffer 111 during clock cycle T4. Read buffer 111 is refreshed in response to the logic high REFP[r] signal during clock cycle T4 (See, FIG. 5). Also, since the access does not involve memory bank [c] (i.e., BA[c]="0"), the refresh pending in memory bank [c] can now be performed as follows.

The logic low BA[c] signal cause the internal refresh signal REF[c] to be asserted high, thereby causing the memory array timing signals RAS#[c], SEN#[c] and PRC#[c] to be triggered by the corresponding global timing signals RAS#, SEN# and PRC# generated by memory sequencer 103 (FIG. 1). A refresh cycle is thus carried out by memory bank [c]. Notice that column switch control signal CAS#[c] is not activated during a refresh cycle, as data in the sense amplifiers are not accessed. The logic low BA[c] signal prevents the CAS#[c] signal from being activated. (See, FIG. 3, NAND gate 312.)

The fourth read access misses write buffer 110. Consequently, the WBHit signal has a logic low state. Under these conditions, the RBrd, RBwr, WBrd, WBret and WBwr signals all have logic low values (See, FIG. 8). The logic high REN, REFP[r] signals and the logic low WBHit signal cause the memory read signal Mrd to be asserted high (AND gate 902, FIG. 9).

Bank address decoder 105 activates the external bank-select signal EBS[d] high, where 'd' is the bank corresponding with address Ad[13:7]. The low WBrd signal causes multiplexer 115 to route the EBS[127:0] signal provided by bank address decoder 105 to memory blocks 1000–1127 as the BA[127:0] signal.

Memory sequencer 103 generates the global memory timing signals RAS#, SEN#, CAS# and PRC# in response to the rising edge of the Clk signal. In the addressed memory block [d], the logic high BA[d] and Mrd signals cause the local access enable signal ACC#[d] to be asserted low. (See, OR gate 302 and NAND gate 311, FIG. 3.) The low state of the ACC#[da] signal causes the local refresh signal REF[d] to have a logic low value. (See, AND gate 313, FIG. 3.) The logic low ACC#[d] and REF[d] signals enable the memory bank timing control signals RAS#[d], SEN#[d], CAS#[d], and PRC#[d] to be activated by the corresponding global signals RAS#, SEN#, CAS# and PRC#. The data value Dd[127:0] is then driven from read-write port 112 to read/write port output bus RWPO[127:0]. Output multiplexer 109 passes this data value Dd to output data bus DO[127:0] in response to the logic low WBHit and RBHit signals and the logic high REFP[r] signal.

Note that if the read operation of cycle T4 were to hit write buffer 110, then the WBHit signal would have a logic high value. As a result, the write buffer read signal WBrd signal would be asserted high during the first half of cycle T4, and the Mrd signal to be de-asserted low. Under these conditions, the data value Dd would be read from write buffer 110 and provided on output data bus DO[127:0]. Read buffer 111 would still be refreshed during cycle T4 in parallel in the manner described above.

Write access timing

Figure 13:
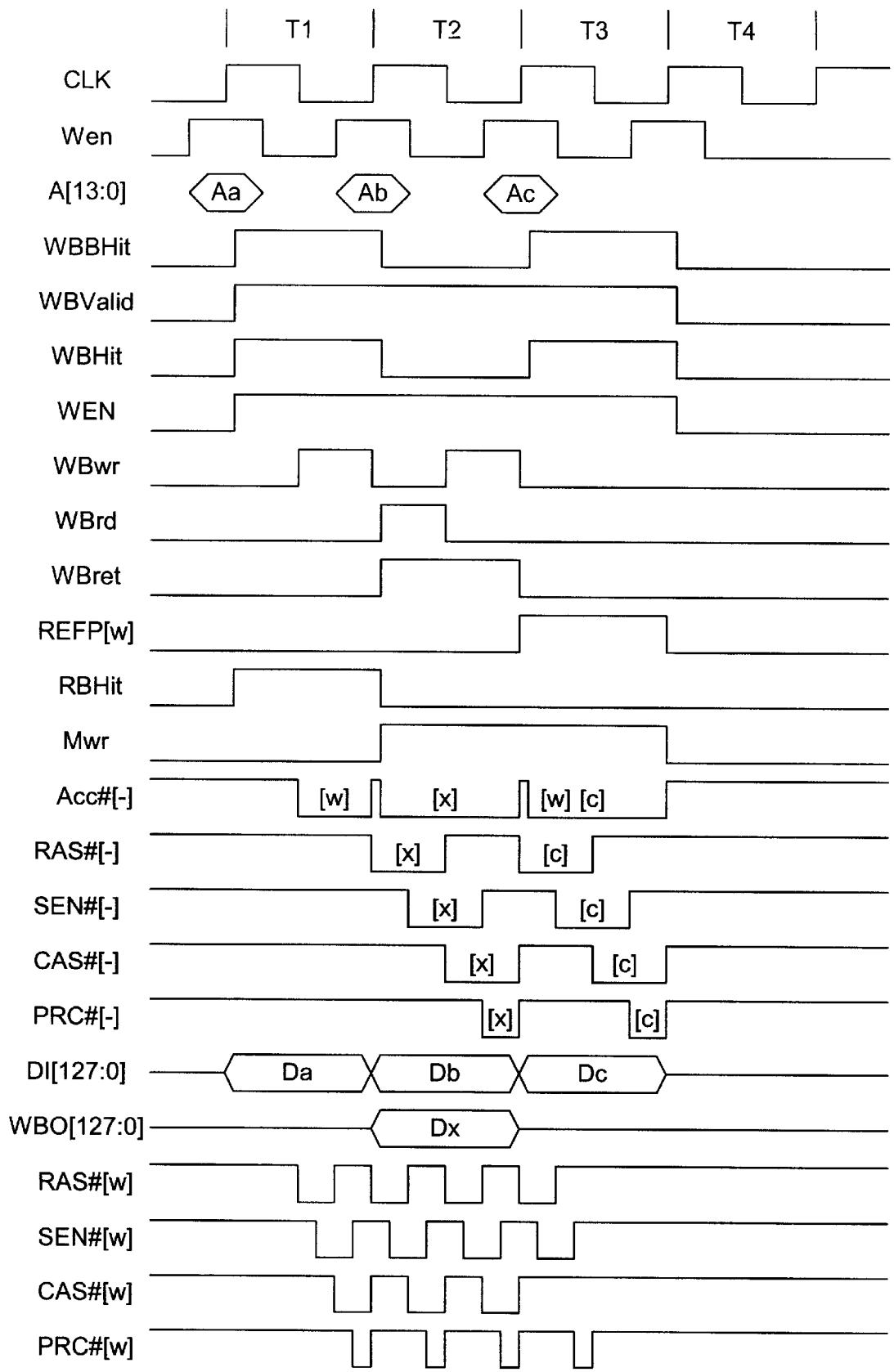
FIG. 13 is a waveform diagram illustrating control signal timing during four different write accesses to the 1-T SRAM system of FIG. 1 in accordance with one embodiment of the present invention.

FIG. 13 is a waveform diagram illustrating the timing of the control signals during three different memory write accesses. The first write access, with external address Aa, illustrates the case of a write buffer hit and a read buffer hit. The second write access, with external address Ab, illustrates the case of a write allocate operation. The third write access, with external address Ac, illustrates the case of a write buffer refresh, wherein the third write access hits write buffer 110.

The first write access to address Aa[13:0] is detected at the rising edge of the Clk signal at the beginning of cycle T1. In response, the access address Aa[13:0] is latched into address register 104. The high state of the external Wen signal is latched by D-register 722 (FIG. 7), thereby driving the local write enable signal WEN high. The bank address Aa[13:7] (i.e., EBA[6:0]) is gated to bank address decoder 105 (FIG. 1), as well as to comparators 741–742 and the read and write buffer cache tag memories 731 and 732 in read-write tag controller 602 (FIG. 7).

Within read-write tag controller 602, the external row-column address Aa[6:0] (ERC[6:0]) is used to select the entry in write buffer tag memory 732 for comparing with the bank address Aa[13:7] (EBA[6:0]). In the present example, the bank address WBBA[6:0] retrieved from write buffer cache tag memory 732 matches the external bank address Aa[6:0]. Because there is a hit, comparator 742 provides a logic high WBBHit signal. In the present example, the valid field corresponding with the retrieved bank address WBBA [6:0] has a logic high (valid) state. As a result, both the WBValid signal and the WBHit signal are driven to logic high states. The high state of the WBBHit signal causes the write buffer retire signal WBret to stay low. (See, AND gate 814 of FIG. 4). The logic high WEN signal, the logic low REFP[w] signal and the logic low Clk signal drive the WBwr signal to a logic high state during the second half of clock cycle T1. (See, AND gate 815 of FIG. 8). The low state of the WBret signal causes the Mwr signal to stay low, thereby suppressing any memory bank access. (See, AND gate 903 and OR gate 912, FIG. 9.)

In write buffer 110 (FIG. 4), the high state of the WBwr signal drives the Acc#[w] signal low, thereby causing the RAS#[w], SEN#[w], CAS#[w] and PRC#[w] to be asserted in a self-timed manner during the second half of clock cycle T1. As a result, the data value Da on input data bus DI[127:0] is written to the entry of write buffer 110 designated by the external row-column address Aa[6:0] (i.e., ERC[6:0]).

In read-write buffer tag control 602 (FIG. 7), the high state of the WBwr signal causes the WBVupdate signal to be asserted, such that the bank address Aa[6:0] is written to write buffer tag memory 732. Because the write buffer tag and bank address Aa[6:0] are the same, this operation does not result in any change in the write buffer bank address tag. The activation of the WBVupdate signal also causes the valid bit associated with the external row-column address ERC[6:0] (i.e., Aa[6:0]) to be set in write buffer cache memory 732 (i.e., WBValidin="1").

In the described example, the first write access also hits a valid entry of read buffer 111. Consquently, comparator 741 provides a logic high RBBHit signal and multiplexer 751 provides a logic high RBValid signal. As a result, the RBHit signal is asserted high. The logic high RBHit and WEN signals cause AND gate 702 to provide a logic high output, thereby asserting the RBVupdate signal. In response to the logic high RBvupdate signal and the logic low RBwr signal, the valid bit in cache memory 761 corresponding with the row column address Aa[6:0] is reset to a logic low value.

The second write access to address Ab[13:0] is detected at the rising edge of the Clk signal at the beginning of cycle T2. In response, the access address Ab[13:0] is latched into address register 104. The high state of the external Wen signal is latched by D-register 722 (FIG. 7), thereby driving the local write enable signal WEN high. The bank address Ab[13:7] (i.e., EBA[6:0]) is gated to bank address decoder 105 (FIG. 1), as well as to comparators 741–742 and the read and write buffer tag memories 731 and 732 in read-write tag controller 602 (FIG. 7).

Within read-write tag controller 602, the external row-column address Ab[6:0] (ERC[6:0]) is used to select the entry in write buffer tag memory 732 for comparing with the bank address Ab[13:7] (EBA[6:0]). In the present example, the bank address WBBA[6:0] retrieved from write buffer cache tag memory 732 does not match the external bank address Aa[6:0]. Because there is a miss, comparator 742 provides a logic low WBBHit signal. In the present example, the valid field corresponding with the retrieved bank address WBBA[6:0] has a logic high (valid) state. As a result, the WBValid signal has a logic high state, and the WBHit signal is driven to a logic low state.

The low state of the WBBHit signal, along with the high states of the WEN and WBValid signals and the low state of the REFP[w] signal, causes the write buffer retire signal WBret to be asserted high. (See, AND gate 814 of FIG. 8). The logic high WBret signal and the logic high Clk signal cause the WBrd signal to be asserted during the first half of cycle T2 (See, AND gate 816, FIG. 8). The logic high WBret signal also causes the memory write enable signal Mwr to be asserted high. (See, OR gate 912, FIG. 9.)

The activation of the WBrd signal during the first half of clock cycle T2 results in a read operation of write buffer 110, with the data value (Dx) in the entry designated by the row-column address Ab[6:0] (ERC[6:0]) being latched and driven onto write buffer output bus WBO[127:0] as the write buffer data signal WBDO. The logic high WBret signal causes multiplexer 113 to route the Dx data value from write buffer 110 to read/write port 112 (and thereby to memory blocks 1000–1127).

In memory bank controller 2007 (FIG. 3), the high state of the Mwr signal initiates a memory write cycle in memory bank [x], which is the memory bank designated by the bank address WBBA[6:0] retrieved from write buffer 110. The high state of the Mwr signal, in turn, causes the access enable signal ACC#[x] to go low. (FIG. 3.) The low state of the ACC#[x] signal allows the activation of the RAS#[x], SEN#[x] and PRC#[x] signals in response to the corresponding input RAS#, SEN# and PRC# signals. The high state of the Mwr signal also allows the CAS#[x] signal to be asserted low in response to the global timing signal CAS#. The sequential activation of the RAS#[x], SEN#[x], CAS#[x] and PRC#[x] signals carries out a write cycle in memory block [x], thereby writing the retiring data value Dx to memory block [x].

At the falling edge of the Clk signal during cycle T2, the WBwr signal is asserted high in response to the logic high WEN signal, the logic low REFP[w] signal and the logic low Clk signal. (See, AND gate 815, FIG. 8.) The logic high WBwr signal initiates a write buffer write operation during the second half of clock cycle T2. Consequently, the RAS# [x], SEN#[x], CAS#[x] and PRC#[x] signals are sequentially asserted in a self-timed manner, such that the input data value Db on the input data bus DI[127:0] is written to write buffer 110 at the entry designated by row-column address Ab[6:0] (ERC[6:0]). The valid bit corresponding with this entry is also set to a logic high value in response to the logic high WBwr signal (and the logic high WEValidin signal).

The third write access begins at the rising edge of clock cycle T3, with both the high state of the Wen signal and the address signal Ac[13:0] being latched. Within read-write tag controller 602 (FIG. 7), the bank address in the entry of write buffer cache memory 732 designated by row-column address Ac[6:0] is driven out from cache tag memory 732 as the write buffer bank address signal WBBA[6:0]. The corresponding valid bit is driven as the WBValid signal. Comparator 742 compares the WBBA[6:0] signal with the current bank address signal Ac[13:7] (EBA[6:0]). In the present example, a match is detected, causing signal WBBHit signal to be asserted high. In the present example, the corresponding WBValid signal has a logic high value. As a result, the WBHit signal is driven high.

Also during the third write access, the write buffer refresh signal REFP[w] is asserted high. Under these conditions, the WBrd, WBret and WBwr signals are all de-asserted low. During cycle T3, write buffer 110 is refreshed in response to the asserted REFP[w] signal, in the manner described above (FIG. 4).

Because write buffer 110 is refreshed during cycle T3, the write operation is performed directly to the memory bank designated by the bank address Ac[13:7] (i.e., memory bank [c]). This write operation is performed as follows. The memory write enable signal Mwr is asserted high in response to the high WEN and REFP[w] signals. (See, AND gate 903 and OR gate 912, FIG. 9.) Bank address decoder 105 decodes the external bank address Ac[13:7], thereby providing the EBS[127:0] address signal which identifies memory bank [c]. Multiplexer 115 passes this address signal EBS[127:0] as the BA[127:0] signal in response to the logic low WBrd signal. Within memory bank [c], the logic high BA[c] and Mwr signals cause the ACC#[c] signal to be asserted low, thereby initiating a write operation within memory bank [c]. (See, NAND gate 311, FIG. 3.) The input data value Dc is written to memory bank [c]. Multiplexer 113 passes the input data value Dc to read/write port 112 (and thereby memory bank [c]) in response to the logic low WBret signal.

Because the third memory access hit write buffer 110, but the data value Dc was not written to write buffer 110, the corresponding entry in write buffer must be invalidated. This invalidation is performed in response to the WBVupdate and WBValidin signals, which are asserted high and de-asserted low, respectively, in response to the logic high REFP[w], WBHit and WEN signals. (See, AND gate 703, OR gate 713, inverter 714, FIG. 7.) The logic high WBVupdate signal enables the logic low WBValidin signal to reset the valid bit of the write buffer cache tag memory 732 designated by the external row-column address Ac[6:0].

Note that if the third write access did not hit write buffer 110, the corresponding entry in write buffer cache tag memory would not be invalidated.

Alternate Embodiments

In another embodiment, the proper refresh period can be increased by incorporating a refresh accumulator in each memory bank. The refresh accumulator consists of an up-down counter. Inputs to the accumulator include: the refresh request signal REFP[n] (FIG. 3), which when activated increments the counter; the refresh acknowledge signal REF[n], which when activated decreases the counter; and the clock signal, which controls the operation of the accumulator. This principle is described in more detail in commonly, owned, co-pending U.S. Pat. No. 5,940,851, which is hereby incorporated by reference in its entirety.

In the discussions for FIGS. 10 and 11 above, write buffer 110 and read buffer 111 are assumed to be fabricated from DRAM cells. In this case, write buffer 110 and read buffer 111 require refresh operations. However, in another embodiment, write buffer 110 and read buffer 111 can be constructed using SRAM cells. In this embodiment, refresh operations to write buffer 110 and read buffer 111 are not necessary. However, this alternative requires the fabrication of both DRAM and SRAM cells. SRAM cells require a significantly larger layout area than corresponding DRAM cells.

Although the invention has been described in connection with several embodiments, it is understood that this invention is not limited to the embodiments disclosed, but is capable of various modifications which would be apparent to a person skilled in the art. For example, the DRAM memory banks, the read buffer and the write buffer can have different sizes in different embodiments. Similarly, different numbers of DRAM banks can be used. Moreover, buses having different widths than those described can be used in other embodiments. In addition, the proper refresh period can be increased by incorporating a refresh accumulator in each memory bank. Moreover, write data masking can be added with minor modifications to the write control in the memory banks, the read and write data buffers and the write buffer valid bits. Thus, the invention is limited only by the following claims.

I claim:

1. A memory system comprising:
   a read/write port;
   a plurality of memory banks, each having an independent access controller, each having memory cells that must be periodically refreshed to retain data values, and each having a single data port;
   an internal data bus coupling each data port to the read/write port;
   a write buffer coupled to the read/write port;
   a read buffer coupled to the read/write port and the write buffer; and
   a control unit coupled to the memory banks, the write buffer and the read buffer, the control unit being configured to control accessing and refreshing of the memory cells such that the refreshing of the memory cells does not interfere with any external write or read accesses.

2. The memory system of claim 1, further comprising a central refresh timer for periodically asserting a refresh request signal.

3. The memory system of claim 2, further comprising daisy-chained connections extending between the access controllers, wherein the daisy-chain connections sequentially pass the refresh request signal to the access controllers in response to a clock signal.

4. The memory system of claim 3, wherein the daisy-chained connections extend to the read buffer and write buffer, such that the daisy-chain connections sequentially pass the refresh request signal to the read buffer and write buffer in response to the clock signal.

5. The memory system of claim 1, further comprising a refresh address generator for generating a refresh address, the refresh address generator being coupled in parallel to all of the access controllers, wherein the refresh address generator increments the refresh address in response to the refresh request signal.

6. The memory system of claim 1, wherein the read buffer has a capacity greater than or equal to the capacity of one of the memory banks minus one row of memory cells, and wherein the write buffer has a capacity greater than or equal to the capacity of one of the memory banks minus one row of memory cells.

7. The memory system of claim 1, wherein the read buffer is constructed from dynamic random access memory (DRAM) cells.

8. The memory system of claim 7, wherein the read buffer is configured to receive a refresh request signal that is periodically asserted, the memory system being configured to perform a refresh operation in the read buffer in the same cycle that the read buffer receives the asserted refresh request signal.

9. The memory system of claim 8, wherein the memory system is configured to perform a read operation from the read buffer during a cycle in which the refresh request signal is not asserted to the read buffer, and a read access hits the read buffer.

10. The memory system of claim 8, wherein the memory system is configured to perform a read operation from the write buffer during a cycle in which a read access misses the read buffer and hits the write buffer.

11. The memory system of claim 8, wherein the memory system is configured to perform a read operation from one of the memory banks and a write operation to the read buffer during a cycle in which a read access misses the read buffer and the write buffer.

12. The memory system of claim 8, wherein the memory system is configured to perform a read operation from the write buffer during a cycle in which a read access hits the write buffer.

13. The memory system of claim 8, wherein the memory system is configured to perform a read operation from one of the memory banks during a cycle in which the refresh request signal is asserted to the read buffer, and a read access misses the write buffer.

14. The memory system of claim 1, wherein the read buffer includes a plurality of entries for storing data values, and wherein the memory controller further comprises:
   a read buffer bank address memory for storing an address of a bank associated with valid data currently stored in one or more entries of the read buffer; and
   a read buffer valid bit memory for storing a plurality of valid indicator bits, wherein each of the entries of the read buffer is associated with a corresponding one of the valid indicator bits.

15. The memory system of claim 14, wherein the read buffer is configured to shadow a portion of one of the memory banks.

16. The memory system of claim 14, wherein the number of valid indicator bits in the read buffer valid bit memory is equal to the number of entries in the read buffer.

17. The memory system of claim 1, wherein the read buffer is constructed from static random access memory (SRAM) cells.

18. The memory system of claim 1, wherein the write buffer is constructed from dynamic random access memory (DRAM) cells.

19. The memory system of claim 18, wherein the write buffer is configured to receive a refresh request signal that is periodically asserted, the memory system being configured to perform a refresh operation in the write buffer when there is no read access hitting the write buffer and the write buffer receives the asserted refresh request signal.

20. The memory system of claim 19, wherein the memory system is configured to perform a write operation to one of the memory banks at the same time the refresh operation is performed.

21. The memory system of claim 20, wherein the memory system is configured to invalidate an entry in the write buffer if the write operation hits the write buffer.

22. The memory system of claim 18, wherein the memory system is configured to perform a write operation to the write buffer during a cycle in which the refresh request signal is not asserted to the write buffer and a write access hits the write buffer.

23. The memory system of claim 18, wherein the memory system is configured to perform a read operation from the write buffer during a first half-cycle, and a write operation to the write buffer during a second half-cycle, during a cycle in which the refresh request signal is not asserted to the write buffer, and a write access misses the write buffer.

24. The memory system of claim 18, wherein the memory system is configured to invalidate an entry in the read buffer if a write access hits the read buffer.

25. The memory system of claim 1, wherein the write buffer is configured to store addresses that are directly mapped to the memory banks.

26. The memory system of claim 1, wherein the write buffer includes a plurality of entries for storing data values, and wherein the memory controller further comprises:
a write buffer tag memory for storing a plurality of entries, wherein each of the entries in the write buffer tag memory corresponds with one of the entries in the write buffer, and further wherein each of the entries in the write buffer tag memory includes a bank address entry for storing an address of a bank associated with valid data currently stored in of the entries of the write buffer, and a valid bit entry for storing a valid indicator bit.

27. The memory system of claim 1, wherein the write buffer is constructed from static random access memory (SRAM) cells.

28. A method of operating a memory system having a plurality of memory banks, a read buffer and a write buffer constructed using memory cells that require periodic refreshing, the method comprising the steps of:
periodically generating a refresh request;
refreshing the read buffer during the same cycle in which a refresh request is detected by the read buffer;
reading data from the read buffer during a cycle in which a read access hits the read buffer and no refresh request is pending in the read buffer;
reading data from the write buffer and writing this data to a corresponding location in one of the memory banks during a cycle in which a read access hits the write buffer;
reading data from one of the memory banks and writing this data to the read buffer during a cycle in which a read access misses the write buffer, misses the read buffer and no refresh request is pending in the read buffer;
reading data from the write buffer during a cycle in which a read access hits the write buffer and a refresh request is pending in the read buffer; and
reading data from one of the memory banks during a cycle in which a read access misses the write buffer and a refresh request is pending in the read buffer.

29. A method of operating a memory system having a plurality of memory banks, a read buffer and a write buffer constructed using memory cells that require periodic refreshing, the method comprising the steps of:
periodically generating a refresh request;
refreshing the write buffer during the same cycle in which a refresh request is detected in the write buffer;
writing data to one of the memory banks during a cycle in which a write access misses the write buffer and a refresh request is pending in the write buffer;
writing data to one of the memory banks and invalidating an entry of the write buffer during a cycle in which a write access hits the write buffer and a refresh request is pending in the write buffer;
writing data to the write buffer during a cycle in which a write access hits the write buffer and no refresh request is pending in the write buffer;
performing a write allocate operation with the write buffer during a cycle in which a write access misses the write buffer and no refresh request is pending in the write buffer; and
invalidating an entry of the read buffer during a cycle in which a write access hits the read buffer.

30. The method of claim 29, wherein the write allocate operation comprises the steps of:
reading a first data value from the write buffer during a first half-cycle of the write access;
writing the first data value to one of the memory banks during the first half-cycle of a write access; and
writing a second data value to the write buffer during a second half-cycle of the write access.

31. A memory device comprising:
a plurality of memory cells configured in a plurality of banks, each of the banks having a single port, wherein the memory cells must be periodically refreshed to retain data values, and wherein each of the banks includes a plurality of rows and columns of memory cells;
a memory controller for controlling the accessing and refreshing of the memory cells such that the refreshing of the memory cells does not interfere with any external read accesses to the memory cells; and
a read buffer coupled to the banks and the memory controller.

32. The memory device of claim 31, wherein the read buffer has a capacity greater than or equal to the capacity of a bank minus one row of memory cells.

33. The memory device of claim 31, wherein the read buffer is constructed from static random access memory (SRAM) cells.

34. The memory device of claim 31, wherein the read buffer is constructed from dynamic random access memory (DRAM) cells.

35. The memory device of claim 31, wherein the memory controller is configured to write a first data value read from one of the banks to the read buffer during a read operation if the first data value is not currently stored in the read buffer.

36. The memory device of claim 35, wherein the memory controller is further configured to write a second data value to the read buffer during an external write access if the external write access addresses a first bank, and the read buffer currently stores a data value associated with the first bank.

37. The memory device of claim 36, wherein the memory controller is further configured to read a data value from the read buffer during an external read access if the read buffer stores the data value requested by the external read access.

38. The memory device of claim 31, wherein the read buffer includes a plurality of entries for storing data values, and wherein the memory controller further comprises:
- a read buffer bank address memory for storing an address of a bank associated with valid data currently stored in one or more entries of the read buffer; and
- a read buffer valid bit memory for storing a plurality of valid indicator bits, wherein each of the entries of the read buffer is associated with a corresponding one of the valid indicator bits.

39. The memory device of claim 38, wherein the read buffer is configured to shadow a portion of one of the banks.

40. A memory device comprising:
- a plurality of memory cells configured in a plurality of banks, each of the banks having a single port, wherein the memory cells must be periodically refreshed to retain data values, and wherein each of the banks includes a plurality of rows and columns of memory cells;
- a memory controller for controlling the accessing and refreshing of the memory cells such that the refreshing of the memory cells does not interfere with any external write accesses to the memory cells; and
- a write buffer coupled to the banks and the memory controller.

41. The memory device of claim 40, wherein the write buffer has a capacity greater than or equal to the capacity of a bank minus one row of memory cells.

42. The memory device of claim 40, wherein the write buffer is constructed from static random access memory (SRAM) cells.

43. The memory device of claim 40, wherein the write buffer is constructed from dynamic random access memory (DRAM) cells.

44. The memory device of claim 40, wherein the write buffer includes a plurality of entries for storing data values, and wherein the memory controller further comprises:
- a write buffer bank address memory for storing addresses of banks associated with valid data currently stored in one or more entries of the write buffer; and
- a write buffer valid bit memory for storing a plurality of valid indicator bits, wherein each of the entries of the write buffer is associated with a corresponding one of the valid indicator bits.

45. The memory device of claim 44, wherein the memory controller is configured to cause data to be retired from the write buffer to the bank whose address is stored in the write buffer bank address memory if an external write access addresses a bank whose address is not stored in the write buffer bank address memory.

46. The memory device of claim 45, wherein the memory controller is configured to enable a refresh operation in the write buffer during any write operations.

* * * * *

UNITED STATES PATENT AND TRADEMARK OFFICE
CERTIFICATE OF CORRECTION

PATENT NO. : 6,370,073 B2
DATED : April 9, 2002
INVENTOR(S) : Wingyu Leung

It is certified that error appears in the above-identified patent and that said Letters Patent is hereby corrected as shown below:

<u>Title page,</u>
Item [73], Assignee, correct spelling is -- Monolithic System Technology, Inc. --

Signed and Sealed this

Ninth Day of March, 2004

JON W. DUDAS
*Acting Director of the United States Patent and Trademark Office*